United States Patent

Hshieh et al.

[11] Patent Number: 5,973,361
[45] Date of Patent: *Oct. 26, 1999

[54] DMOS TRANSISTORS WITH DIFFUSION MERGED BODY REGIONS MANUFACTURED WITH REDUCED NUMBER OF MASKS AND ENHANCED RUGGEDNESS

[75] Inventors: Fwu-Iuan Hshieh, Saratoga; Kong Chong So; Danny Chi Nim, both of San Jose, all of Calif.

[73] Assignee: Magepower Semiconductor Corporation, San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/929,860

[22] Filed: Sep. 15, 1997

Related U.S. Application Data

[63] Continuation-in-part of application No. 08/611,745, Mar. 6, 1996, Pat. No. 5,668,026.

[51] Int. Cl.$^6$ .................................................... H01L 29/78
[52] U.S. Cl. .......................................... 257/341; 257/330
[58] Field of Search .................................. 257/335, 328, 257/341, 330, 331, 332, 334, 339, 640, 649

[56] References Cited

U.S. PATENT DOCUMENTS

| | | | |
|---|---|---|---|
| 4,705,759 | 11/1987 | Lidow et al. | 257/327 |
| 5,043,779 | 8/1991 | Nishimura | 257/341 |
| 5,070,377 | 12/1991 | Harada | 257/339 |
| 5,408,117 | 4/1995 | Uenishi | 257/339 |
| 5,416,354 | 5/1995 | Blackstone | 257/499 |
| 5,656,843 | 8/1997 | Goodyear et al. | 257/339 |
| 5,701,023 | 12/1997 | Bulucea et al. | 257/339 |
| 5,719,421 | 2/1998 | Hutter et al. | 257/335 |

FOREIGN PATENT DOCUMENTS

| | | | |
|---|---|---|---|
| 4-186776 | 7/1992 | Japan | 257/330 |
| 6-163909 | 6/1994 | Japan | 257/335 |

*Primary Examiner*—David B. Hardy
*Attorney, Agent, or Firm*—Bo-In Lin

[57] ABSTRACT

A new transistor cell is disclosed in this invention which is formed in a semiconductor substrate with a drain region of a first conductivity type formed at a bottom surface of the substrate. The DMOS cell includes a polysilicon layer constituting a gate supported on a top surface of the substrate, the gate surrounding and defining an outer boundary of the transistor cell having a removed polysilicon opening disposed substantially in a central portion of the cell. The DMOS cell further includes a source region of the first conductivity disposed in the substrate near edges of the removed polysilicon opening with a portion extends underneath the gate. The DMOS cell further includes a body region of a second conductivity type disposed in the substrate occupying an entire region under the removed polysilicon opening thus encompassing the source region and having a portion extends underneath the gate. The body region defining substantially a merged-double-U-shaped region including a left-U-shaped implant region and a right-U-shaped implant region and a merged region disposed substantially at a central portion under the removed polysilicon opening. In a preferred embodiment, the merged double-U-shaped region constituting the body region further includes a deep high concentration body dopant region and a shallow high concentration body dopant region.

13 Claims, 20 Drawing Sheets

DMOS TRANSISTORS WITH DIFFUSION MERGED BODY REGIONS MANUFACTURED WITH REDUCED NUMBER OF MASKS AND ENHANCED RUGGEDNESS

This Patent Application is a Continuos-in-Part Patent (CIP) Patent Application of a pending Application Ser. No. 08/611,745 filed on Mar. 6, 1996, now U.S. Pat. No. 5,668,026.

BACKGROUND OF THE INVENTION

1. Field of the Invention

This invention relates generally to the structure and fabrication process of trenched DMOS transistors. More particularly, this invention relates to a novel and improved DMOS structure and fabrication process wherein reduced number of masks are employed such that the DMOS devices can be manufactured at lower cost and additionally, the device ruggedness is strengthened and the source contact resistance is reduced.

2. Description of the Prior Art

The fabrication cost of a semiconductor device is often adversely affected due to an increase in the number of masks required in the fabrication process. The fabrication cost for a double-diffusion metal oxide semiconductor (DMOS) device is kept at a relative high level when applying the conventional fabrication methods. The more rigid cost structure for DMOS fabrication is due to the technical difficulty that the number of masks required in device fabrication cannot be easily reduced. Cost reduction in DMOS fabrication is therefore not achievable when the required number of masks remains unchanged.

In addition to the consideration of fabrication costs, the production yield is increased when the number of masks employed in the fabrication process is reduced. A simplified fabrication process with less masks generally reduces the uncertainties and uncontrollable factors during fabrication and leads to yield rate improvement. Again, in the conventional DMOS fabrication techniques, simplified fabrication process with reduction of mask requirements is not easily achievable and yield improvement is still a goal beyond reach.

The number of masks required in DMOS fabrication is closely related to the structure of a DMOS transistor. Please refer to FIGS. 1A and 1B for a general device structure of a planar DMOS transistor 10 and 10' respectively where a cross-sectional views of typical DMOS cells 10 and 10' in the core cell region are shown. The DMOS transistor is supported on a N+ substrate 15 and an N-epi-taxial layer 20 formed on its top. The cell 10 includes a deep $p^+$-body region 25, a shallow p body 26, a source region 30 wherein the source region 30 and the p-body region 26 surround a gate 40 insulated by a gate oxide layer 35. The DMOS cell 10 is then covered with a PSG or BPSG protection layer 45. A contact 50 is then formed on top of the source region 30. The DMOS structures as shown for both the planar and trenched DMOS require that the source regions 30 be shorted to the body 25 where a channel is formed for conducting a source-to-drain current. This general structural feature imposes the following basic requirements on the fabrication processes:

(1) The deep $p^+$ regions 25 and the p-body regions 26 are usually formed prior to the formation of the source regions 30; and (2) Subsequent to the formation of the p-body region 26, the source regions 30 are then formed within the p-body regions 26 wherein the source regions 30 are shallower and have a different cross-sectional profile than the p-body regions 26.

Due to the facts that the source regions 30 are formed with different cross sectional profile than that of the p-body region 26, in a conventional DMOS fabrication process, two separate masks are usually applied to form the deep $p^+$ regions 25 and the source regions. Several technical approaches are applied in the prior art as described below with some of these techniques employed to reduce the number of masks required in DMOS fabrication by eliminating the requirement for a separate mask for source implant. However, as will be further explained below, these prior art techniques for DMOS fabrication, even with reduced number of masks, are still limited by other technical difficulties.

FIG. 2 depicts a typical prior art approach used to form the source regions 30 in a p-body region 26. A source mask is applied to form a plurality of photoresist blocks 55 above the source regions 30. A source implant with ion beam 60 is then carried out. Part of the ion beam is blocked by the photoresist blocks 55 in forming the source regions 30. Due to the fact that in this traditional fabrication process, a separate source mask is required to form the source block 55, many invention disclosed in several US Patents provide new approaches to eliminate the use of this separate source mask.

In a U.S. Pat. No. 4,443,931, entitled "Method of Fabricating a Semiconductor Device with a Base Region Having a Deep Portion" (issued on Apr. 24, 1984), Baliga et al. disclose a MOSFET device. The MOSFET device is fabricated by depositing a LPCVD nitride layer after the poly gate is etched. A $p^+$ mask is applied to open a $p^+$-diffusion window. A p-type dopant is then diffused through the $p^+$ diffusion window. A thick oxide layer is then thermally grown over the $p^+$ diffusion window. An active mask is applied to selective etch the initial oxide layer. Because the oxide layer grown over the $p^+$ diffusion window has a greater thickness, an oxide plug is left covering a portion of the $p^+$-diffusion window after the etching process. The oxide plug is then applied as a block for source implant. This method is limited by the difficulty that the transistor cannot be shrunk due to a consideration that the deep $p^+$ region may encroach the channel when the core cells are fabricated with reduced dimension. The fabrication technique is also practically limited in its usefulness due to the more complicate processes.

In another patent, Baliga et al. in U.S. Pat. No. 4,567,641 entitled "Method of Fabricating Semiconductor Devices Having A Diffused Region of Reduced Length" disclose a method of fabricating a semiconductor device where the requirement of a source blocking mask is eliminated. The processing steps are shown in FIGS. 3A to 3D. (FIGS. 4A to 4D in Baliga's Patent). In FIG. 3A, a semiconductor body 200, e.g., a silicon wafer, includes a substrate 202 constituting an $N^+$-drain and a N-region 204. On the upper surface 205 of the body 200, an insulating layer 206 is formed followed by deposition of a layer 208 composed of a doped polysilicon material on the insulating layer 206. Another insulating layer of silicon oxide is grown on top of the polysilicon layer 208. Finally, a layer 211 composed of aluminum oxide is deposited on top of the oxide layer 210. A photolithography process is then employed to produce a mask 216 as that shown in FIG. 3B which defines a window 217 and serves as a diffusion barrier when a P-type diffusion through the window 217 is made to form the P base 218.

In FIG. 3C, A N+ diffusion is made through the window 217 to form a N+ source region 220 which extends laterally beneath the polysilicon layer 208 thus forming a region 222 with the lateral diffusion distance approximately the same distance diffused in the downward-vertical direction. The diffusion of the N+ region occurs at an elevated temperature in an oxidizing atmosphere. As a result, the exposed surface 219 (shown in FIG. 3B) becomes oxidized and forming an oxide layer 221. In FIG. 3D, an anisotropic etchant to the oxide layer 221 through the window 217 is applied. This etchant etches through the oxide layer 221 substantially all the way through the N+ region 220 while allows the shoulder 223 of the N+ source 220 to remain intact. Specifically, the anisotropic etchant can be a vertically collimated-beam of reactive ions or a planar plasma etchant and forms a generally U-shaped groove 224. Alternatively, a V-shaped groove could be formed. Thus the source regions 220 are formed in the P base region 218 without requiring the use of a source mask.

The semiconductor device disclosed by Baliga et al., in U.S. Pat. No. 4,567,641, is limited by the fact that the DMOS fabrication process as disclosed involves a more complicate procedure where anisotropic etch is to be performed to etch a silicon groove through the oxide layer. Such procedure is more difficult to perform and therefore more costly. The device by Baliga et al. has another technical limitation that the contact-resistance resistance is relative high due to a reduction of $n^+$ contact area because only the N+ side-walls are in contact with metal when the U-shape groove is formed in the P region 218. For those reasons, even that the fabrication procedure disclosed by Baliga et al. is able to eliminated the mask used for source implant, does not provide an effective device fabrication method due to its higher contact-resistance and more complicated fabrication procedures.

Another difficulty faced by those engaged in power MOSFET manufacture in attempt to reduce the production cost by reducing the number of required number of masks is the concerns related to device ruggedness. A designer is faced with a constant challenge to increase the device ruggedness due to the fact that various internal parasitic components often impose design and performance limitations to a conventional power metal oxide silicon field effect transistor (MOSFET). Among these parasitic components in a MOSFET transistor, special care must be taken in dealing with a parasitic npn bipolar junction transistor (BJT) formed between the source, the body, and the drain. Under normal static conditions the base and emitter of the parasitic BJT are shorted, leaving only the body-drain diode effective. However, in a transient conditions and during an avalanche breakdown, the parasitic BJT may be activated incidentally which can seriously degrade the overall performance of the MOSFET. Under the circumstances when the parasitic bipolar junction transistor is incidentally activated, snap back may occur which can cause permanent damages to the device. For this reason, precaution must be taken to increase the ruggedness of the device by taking into account that an incidental activation of the parasitic BJT should be prevented in an avalanche breakdown condition when large amount of hole current is generated in the core cell area.

For the purpose of improving device ruggedness, more complicate manufacture processes are often applied which involve either the use of implant mask to form a buried body implant region under the source region or the formation of spacer. Either of these approaches leads to increase in production costs due to the more elaborate and complicate manufacture processes. Device reliability is often adversely affected due to the degradation of gate oxide when spacers are employed to form the self-aligned buried body regions.

Because of these difficulties, those of ordinary skill in the art are still limited by the dilemma that the goal of cost reduction by simplifying manufacture processes with reduced number of masks appears to run against another design goal of improving the device ruggedness. Several prior art Patents disclose methods to increase device ruggedness, e.g., U.S. Pat. No. 5,119,153 by Korman et al., and U.S. Pat. No. 5,268,586 by Mukherjee et al., are clear illustrations of the technical difficulties faced by those engaged in DMOS design and manufacture today.

Therefore, there is still a need in the art of power device fabrication, particularly for DMOS design and fabrication, to provide a structure and fabrication process that would resolve these difficulties.

SUMMARY OF THE PRESENT INVENTION

It is therefore an object of the present invention to provide a new DMOS fabrication process and a new cell structure to enable those of ordinary skill in the art of DMOS fabrication to reduce the number of masks and to improve the device ruggedness such that aforementioned limitations and difficulties as encountered in the prior art can be overcome.

Specifically, it is an object of the present invention to provide an improved DMOS fabrication process wherein the requirement of applying a separate masks specifically for forming the source regions and $p^+$ regions are eliminated such that the number of masks required to fabricate a DMOS transistor can be reduced.

Another object of the present invention is to provide an improved DMOS fabrication process wherein an active mask for patterning the initial oxide layer is specially configured to form a plurality of source implant blocking stumps above the surface areas near the source regions for the purpose of eliminating the mask requirement in performing the source implant.

Another object of the present invention is to provide an improved DMOS fabrication process wherein the source implant blocking stumps patterned by the use of an active mask is specially designed to have an appropriate width less than twice the lateral diffusion length of the body dopants while greater than twice the lateral diffusion length of the source dopants such that a body-merge can take place in body diffusion process to form an integral body underneath the source-block stumps while the source regions will not be merged underneath the blocking stumps during diffusion whereby the source regions can be formed with appropriate geometrical profile in the body regions.

Another object of the present invention is to provide an improved DMOS fabrication process where a simplified fabrication method is employed by reducing the number of masks thus reducing the cost of manufacture and meanwhile increasing the production yield-rate for DMOS fabrication.

Another object of the present invention is to provide a new and novel DMOS cell structure, and fabrication process to form the self aligned deep and shallow high-concentration body-dopant regions to improve the device ruggedness and to remove a top portion of the lightly doped source region to reduce the contact resistance such that limitations encountered in the prior art can be overcome.

Another object of the present invention is to provide a new and improved DMOS manufacture process and cell structure by performing the shallow and deep p+ body implant operations after the contact opening process wherein the thick insulation layers covering the gates are employed as ion-blocks for body implants to form the self-aligned deep and shallow p+ body regions and followed by removing the lightly doped n+ surface portion as the result of doping compensation form the p+ body implants in the contact openings whereby the contact resistance is reduced.

Another object of the present invention is to provide a new and improved DMOS manufacture process and cell structure by performing the shallow and deep p+ body implant operations after the contact opening process wherein the thick insulation layers covering the gates are employed as ion-blocks for body implants to form the self-aligned deep and shallow p+ body regions and a high energy ion implant to form the deep p+ body region is performed either without an implant oxide or with an implant angle less than seven degrees (7°), e.g., at zero degree, from a perpendicular direction to the substrate surface, in order to form a deeper channeling-enhanced high concentration body dopant profile in the body region to further improve the device ruggedness.

Another object of the present invention is to provide a new and improved DMOS manufacture process and cell structure by performing the shallow and deep body implant operations after the contact opening process wherein the thick insulation layers covering the gates are employed as ion-blocks for body implants to form the self-aligned deep and shallow high concentration body regions whereby the requirement of additional masks or sidewall spacers as that employed in the prior art are no longer necessary and higher product quality and reliability can be achieved with this simplified manufacture process.

Another object of the present invention is to provide a new and improved DMOS manufacture process and cell structure by performing the shallow and deep body implant operations after the contact opening process wherein the thick insulation layers covering the gates are employed as ion-blocks for body implants to form the self-aligned deep and shallow body regions wherein the p+ body-dopant regions are kept at a certain lateral distance away from the channel regions by taking advantage of the thickness of the insulation layers applied as ion blocks whereby the concerns of threshold voltage increase caused by lateral diffusion of the body dopant to the channel regions as that encountered in the prior art are eliminated.

Briefly, in a preferred embodiment, the present invention includes a DMOS fabrication process for fabricating a DMOS transistor on a substrate. The fabrication process includes the steps of (a) growing an oxide layer on the substrate; (b) applying a first mask for removing the oxide layer to define an active area and for selectively patterning the oxide layer for keeping a plurality of source implant blocking stumps near a plurality source regions in the substrate wherein the blocking stumps being formed with width greater than twice a lateral diffusion length of a source dopant and with width less than twice a lateral diffusion length of the body dopant whereby the body regions merging together in the body diffusion and becoming a single body region underneath the blocking stumps; (c) applying a second mask for forming a plurality of gates covering a portion of areas between the blocking stumps thus defining an implant window; (d) implanting a body dopant through the implant window followed by a body diffusion for forming a body region underneath the blocking stumps; (e) implanting the source dopant through the implant window over the source implant blocking stumps following by a source diffusion for forming separate source regions underneath the blocking stumps; (f) removing the source implant blocking stumps from the implant window; (g) employing a contact mask for etching through the insulating dielectric BPSG/PSG layer to define contact windows; (h) performing a shallow high concentration body implant to form the shallow S-p+ region and a deep high concentration body implant to form the deep D-p+ region; (i) depositing a metal layer to form a contact layer through the contact window; and (j) patterning the metal layer with a metal contact to define a plurality of contacts whereby the DMOS transistor is fabricated with a four masks process.

In a preferred embodiment, this invention discloses a DMOS transistor cell formed in a semiconductor substrate with a drain region of a first conductivity type formed at a bottom surface of the substrate. The DMOS cell includes a polysilicon layer constituting a gate supported on a top surface of the substrate, the gate surrounding and defining an outer boundary of the transistor cell having a removed polysilicon opening disposed substantially in a central portion of the cell. The DMOS cell further includes a source region of the first conductivity disposed in the substrate near edges of the removed polysilicon opening with a portion extends underneath the gate. The DMOS cell further includes a body region of a second conductivity type disposed in the substrate occupying an entire region under the removed polysilicon opening thus encompassing the source region and having a portion extends underneath the gate. The body region defining substantially a merged-double-U-shaped region including a left-U-shaped implant region and a right-U-shaped implant region and a merged region disposed substantially at a central portion under the removed polysilicon opening. In a preferred embodiment, the merged double-U-shaped region constituting the body region further includes a deep high concentration body dopant region and a shallow high concentration body dopant region. In another preferred embodiment, the shallow high concentration body dopant region further includes an exposed substrate top surface constituting an enhanced source contact surface defined by a removed top layer of the shallow high concentration body dopant region.

In another preferred embodiment, this invention also discloses a DMOS transistor cell formed in a semiconductor substrate with a drain region of a first conductivity type formed at a bottom surface of the substrate. The DMOS transistor cell includes a polysilicon layer constituting a gate supported on a top surface of the substrate, the gate surrounding and defining an outer boundary of the transistor cell having a removed polysilicon opening disposed substantially in a central portion of the cell. The DMOS transistor cell further includes a source region of the first conductivity disposed in the substrate near edges of the removed polysilicon opening with a portion extends underneath the gate. The DMOS transistor cell further includes a shallow high concentration body dopant region of a second conductivity type disposed substantially in a central portion under the removed polysilicon opening. The DMOS transistor cell further includes a body region of a second conductivity type disposed in the substrate occupying an entire region under the removed polysilicon opening thus encompassing the source region and having a portion extends underneath the gate. The body region includes a left body region and a right body region connected by the shallow high concentration body dopant region. In a preferred embodiment, the body region further includes a deep high concentration body dopant region. In another preferred embodiment, the shallow high concentration body dopant region further includes an exposed substrate top surface constituting an enhanced source contact surface defined by a removed top layer of the shallow high concentration body dopant region.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

A novel DMOS fabrication process is disclosed in this invention wherein a mask required for source implant in a conventional fabrication method is eliminated. This is achieved by applying a specially shaped active mask in patterning the field oxide to leave a plurality of thick oxide pads as implant blocking stumps. These thick oxide pads are then employed as blocks for source implant thus eliminating the requirement of a mask for forming the source blocks before the performance of a source implant. The oxide pads are then subsequently etched and removed. A dry contact etch is carried out to remove a top portion of the substrate to reduce the contact resistance. Detail processing steps for this novel DMOS fabrication process are described below.

Figure 1A:
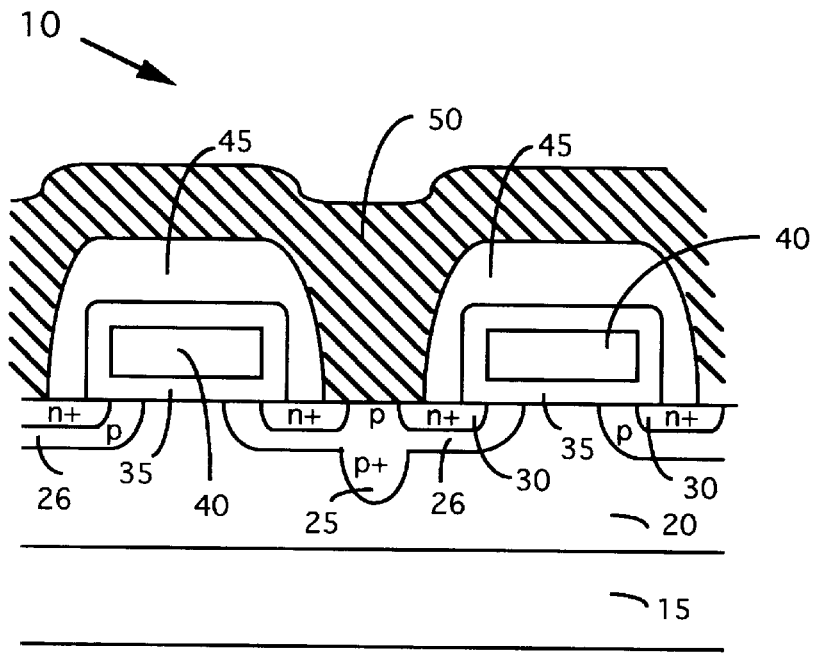
FIGS. 1A and 1B are a cross-sectional views of a prior art planar and trenched DMOS transistor respectively.
Figure 1B:
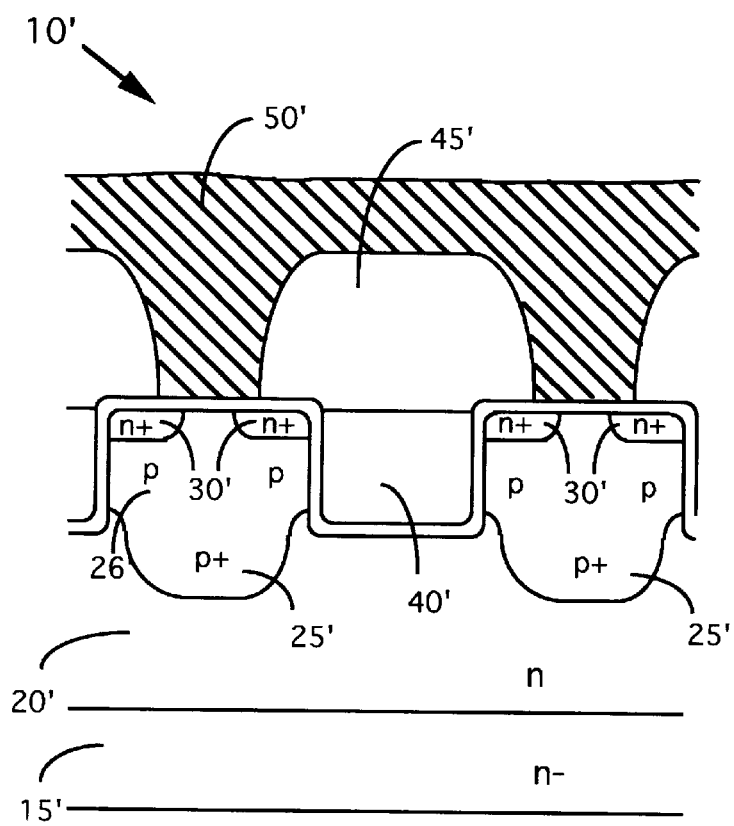
Figure 2:
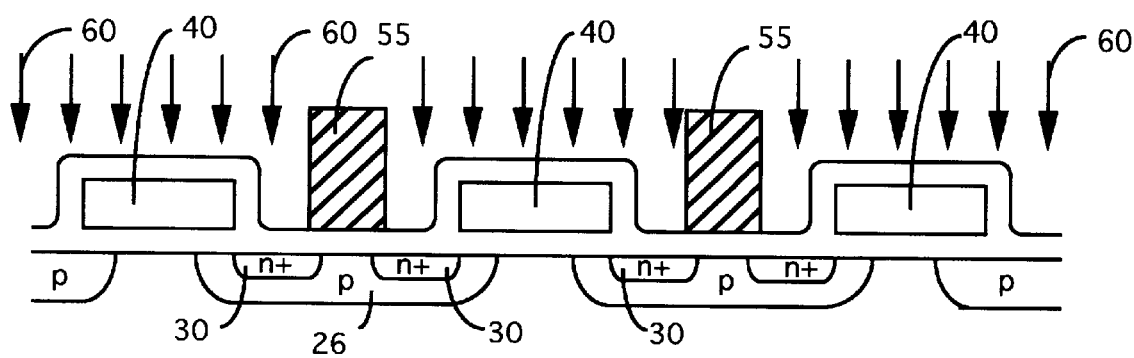
FIG. 2 is a cross sectional view to show a conventional fabrication process applying a source block to implant the source regions.
Figure 3A:
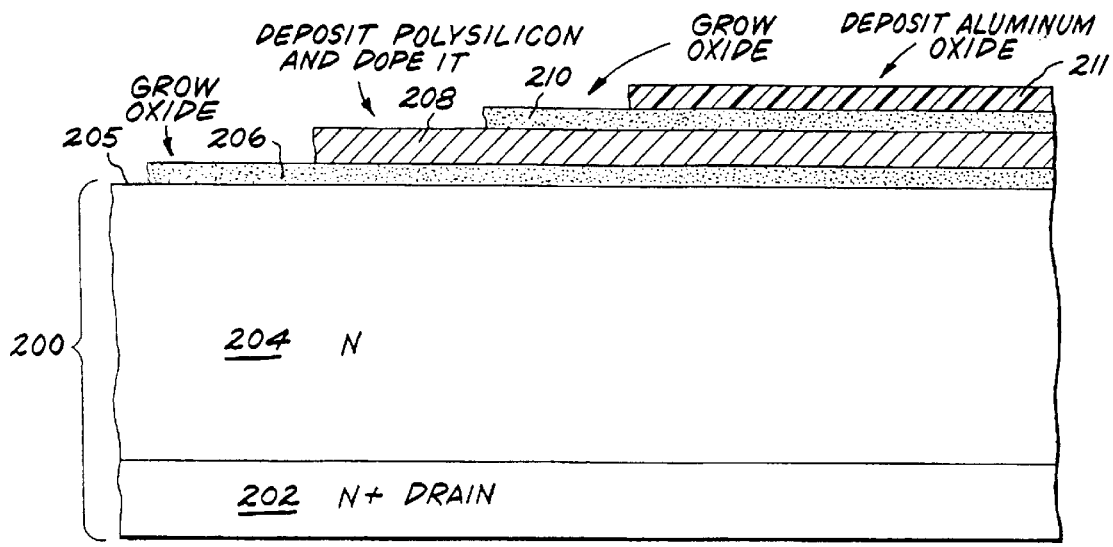
FIGS. 3A to 3D are cross sectional views showing the processing steps of a prior art patent for forming source regions in a DMOS transistor.
Figure 3B:
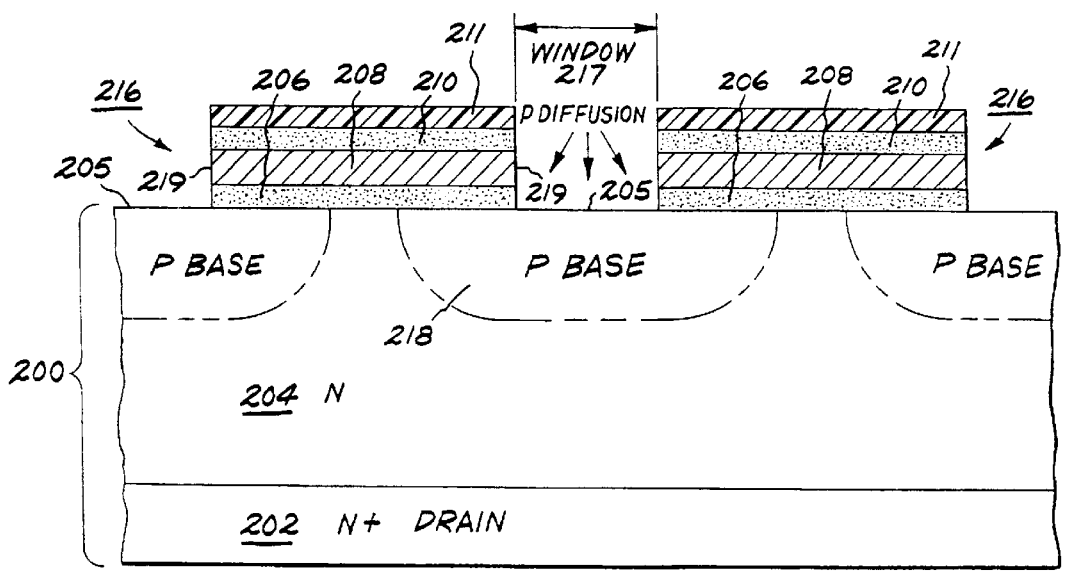
Figure 3C:
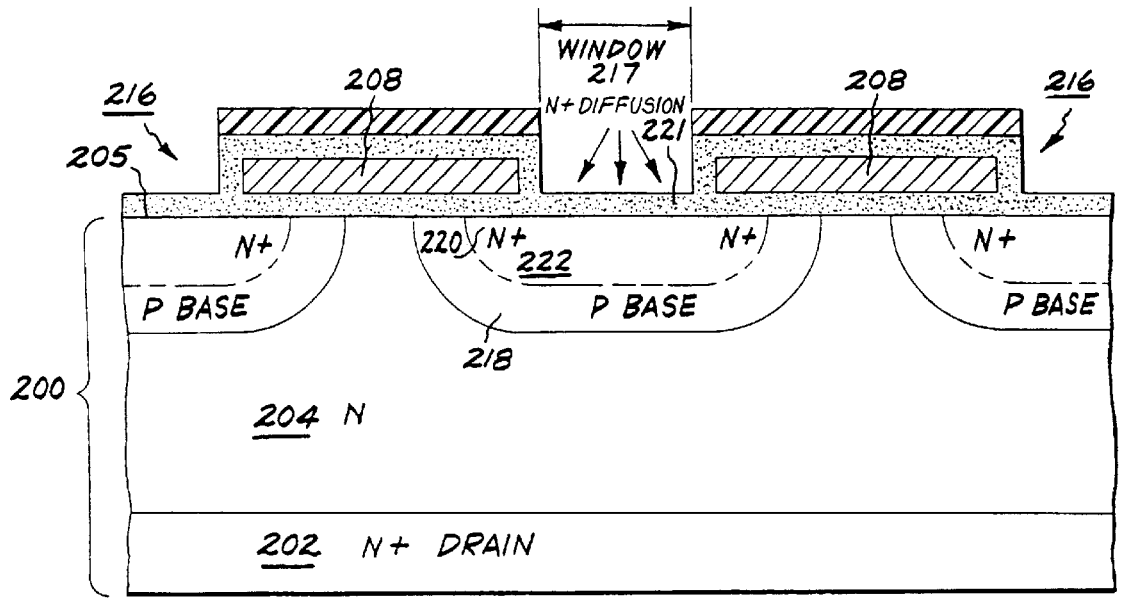
Figure 3D:
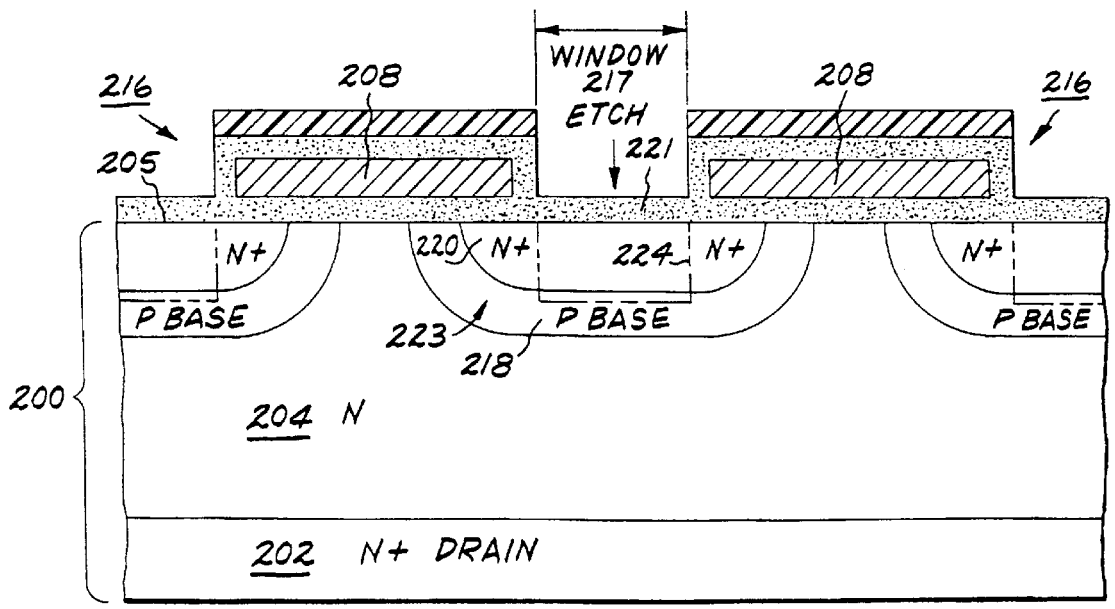
Figure 4A:
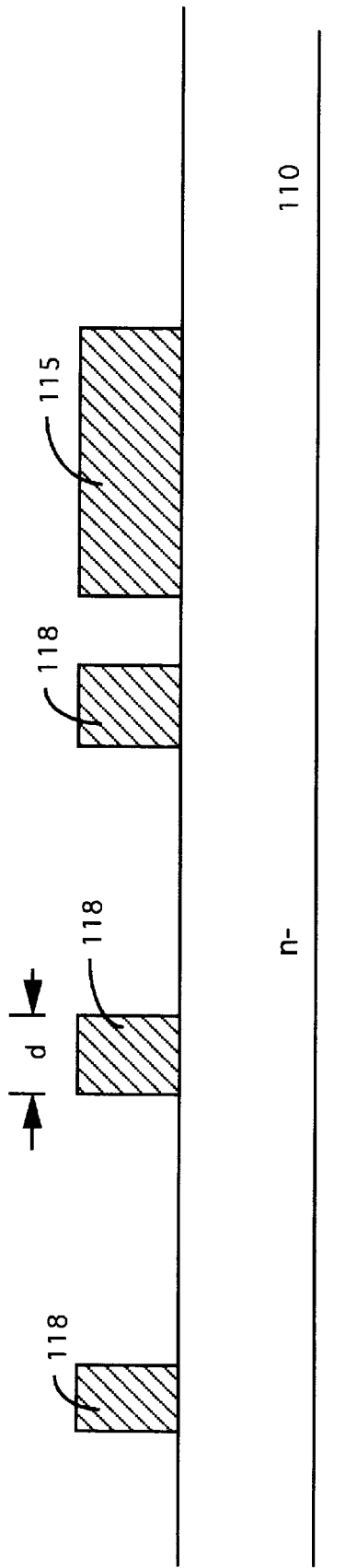
FIGS. 4A to 4F show the processing steps for manufacturing a planar DMOS device of the present invention.

Please refer to FIGS. 4A to 4F for the processing steps in manufacturing the DMOS device 100. As shown in FIG. 4A, the processing steps begins by first growing a N- epitaxial layer 110 with a resistivity ranging from 0.1 to 10 ohm-cm on top of a N+ substrate 105. The substrate has a resistivity of 0.001 to 0.02 ohm-cm. The thickness and the resistivity of the epitaxial layer 110 depend on the device requirements for the on-resistance and breakdown voltage. In a preferred embodiment, the thickness of the epi-layer 110 is about six to eight microns. An initial oxide layer 115 of thickness in the range of 500 nm to 1.0 $\mu$m is grown. The thickness is chosen for the purpose of minimizing the parasitic effect as well as to block the implantation of the dopant in subsequent processing step as will be described below. The oxide layer 115 is then patterned by applying an active mask, i.e., the first mask, to define the active areas and a plurality of source-blocking "stumps" 118. The field oxide layer 115 is kept on the edge of the device area to form a termination area later in the fabrication processes. Additionally, different from the conventional fabrication processing method, a plurality of source-blocking stumps 118 are kept in source region (to be described later), as oxide pads, of the DMOS 100. The lateral dimension, i.e., d, of the blocking stumps is chosen to range between twice the lateral diffusion length of the source dopant, i.e., $2L_s$, and twice the lateral diffusion length of the body (channel) dopant, i.e., $2L_b$. The width d of the blocking stumps 118 can therefore be represented as:

$$2L_s < d < 2L_b \quad (1)$$

Figure 4B:
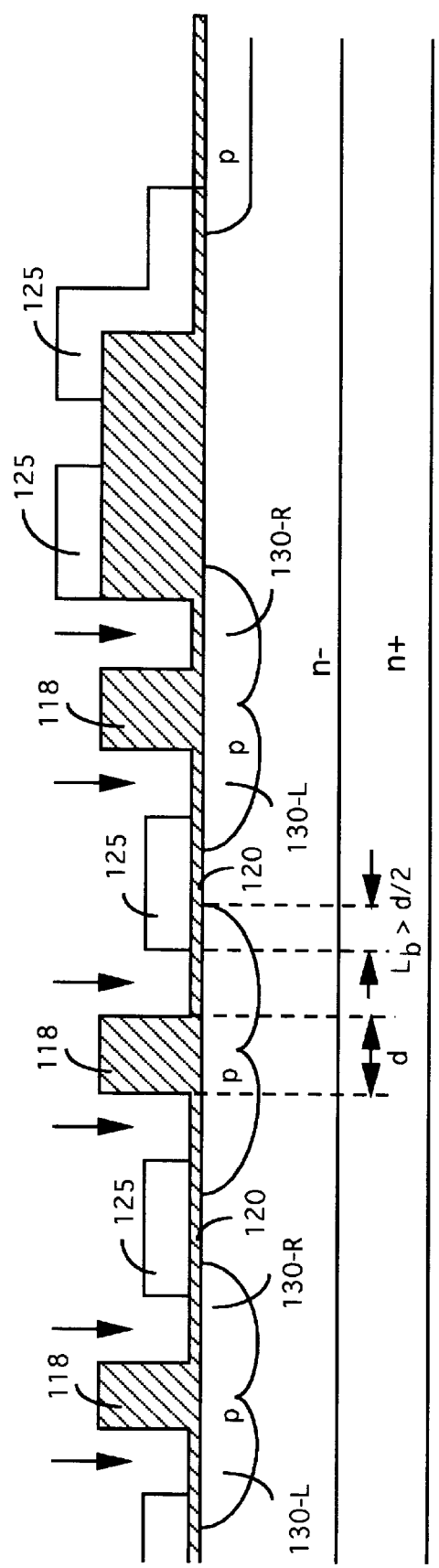

Please refer to FIG. 4B, a gate oxidation process is first carried out to form a gate oxide layer 120 which has a thickness ranging from 2 to 200 nm. A polysilicon layer 125 of thickness ranging from 200 to 1000 nm is then deposited on the gate oxide layer 120. A POCL$_3$ doping process is carried out followed by an arsenic (As) implant process with an ion beam of energy at 60–80 Kev with a flux density in the range between 5 to $8 \times 10^{15}/\text{cm}^2$. A poly mask, i.e., the second mask, is then applied to carry out the an anisotropic etching process to define the poly gate 125. A p-body implant at 30–100 Kev with an ion beam of $3 \times 10^{13}$ to $3 \times 10^{14}/\text{cm}^2$ flux density is applied to implant the p-body regions 130. The body implant is blocked by the thick oxide pads above the source region, i.e., the source-blocking stumps 118, initially two separate p-body regions 130-L and 130-R are formed on the left and the right of the blocking stump 118 respectively. The resist is then stripped and a p-body diffusion process is then carried out at an elevated temperature of 1,000–1,200° C. for ten minutes to three hours to increase the depth of the p-body region 130 to 1.0–6.0 $\mu$m. Because the lateral dimension, i.e., the width d of the stump 118, is less than twice the lateral diffusion length of the body dopants, these two separate p- body regions are merged into a single p-body region 130 underneath the blocking stump 118 because of the lateral diffusion of the body dopants during the diffusion process. The transistor 100 thus includes a diffusion-merged p-body region 130 wherein the profile of the diffusion-merged p-body 130 has a wide-shallow W-profile as that shown in FIG. 4B.

Figure 4C:
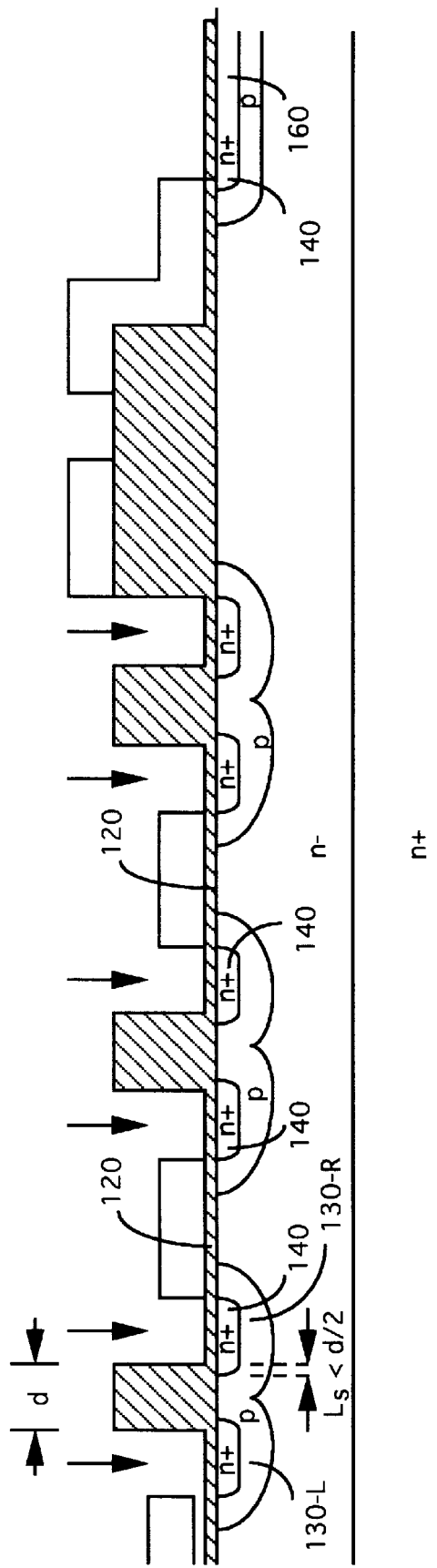

Referring to FIG. 4C, applying the source blocking stumps 118 as source blocks, a N$^+$ implantation is carried out with an ion beam at an energy of 60–100 Kev and ion flux density of $5 \times 10^{15}$ to $1 \times 10^{16}/\text{cm}^2$ to form the source regions 140. Different from the conventional DMOS fabrication process, the source implant is performed without requiring a source mask. The N$^+$ source regions 140 are driven into desired junction depth ranging from 0.2 to 1.0 $\mu$ by a diffusion process. Since the width d of the blocking stumps 118 exceed twice the lateral diffusion length of the source dopants, the source regions are not merged underneath the blocking stumps 118.

Figure 4D:
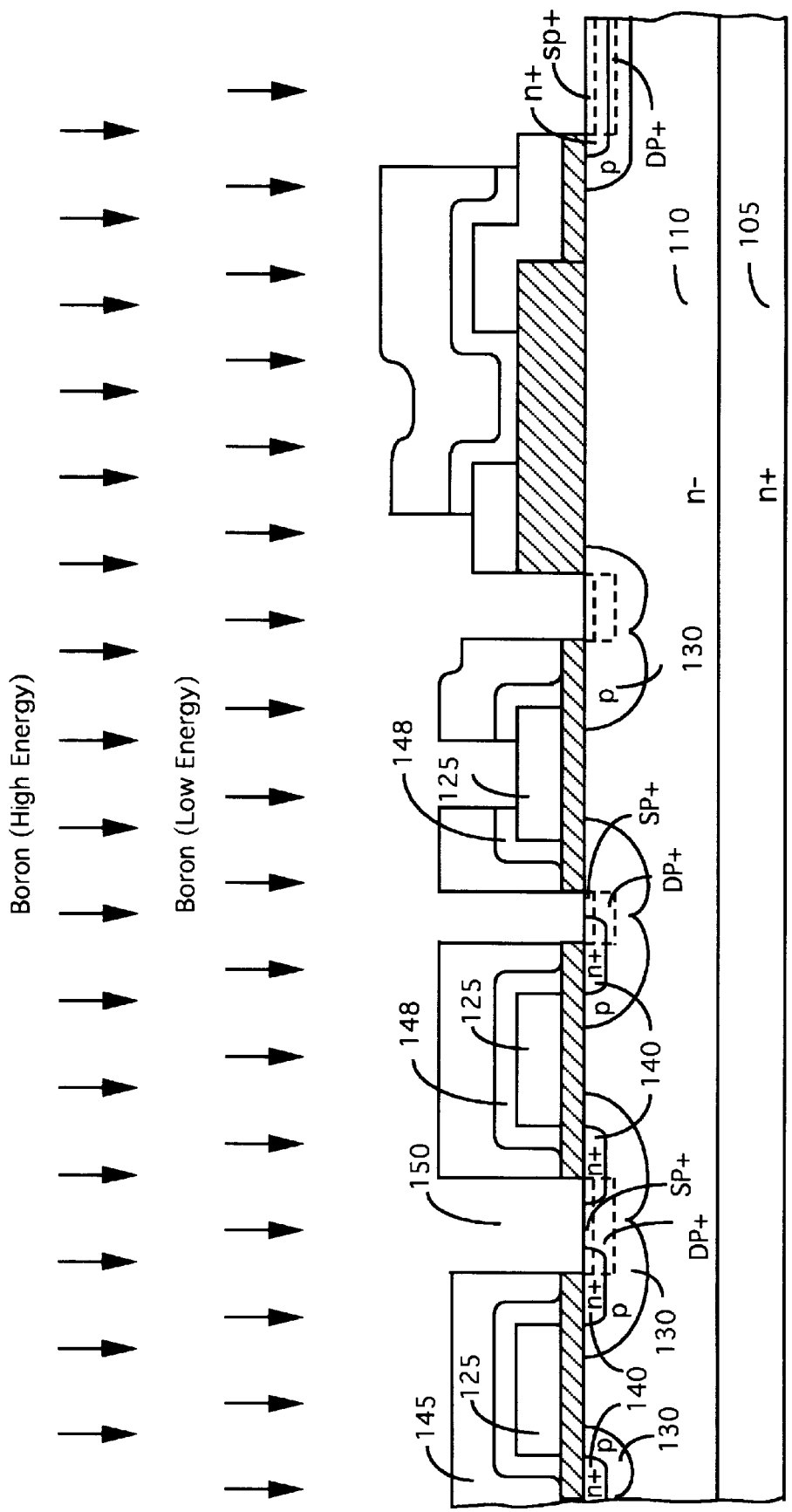

Referring to FIG. 4D, after the source blocking stumps 118 are removed, a NSG or PSG is deposited to form a first insulation layer 148 of approximately 1000–5,000 Å in thickness. A BPSG layer is deposited to form a second insulation layer 145 of about 5,000 to 15,000 Å in thickness. A contact mask is applied to perform an etching process to define a plurality of contact windows 150. A shallow body implant is performed to form a shallow high concentration body region 160 with either a low energy boron implant with an ion flux of $1 \times 10^{14}$ to $2 \times 10^{15}/\text{cm}^2$ at about 20 to 60 Kev or a high energy BF$_2$ implant with an ion flux of $1 \times 10^{14}/\text{cm}^2$ to $2 \times 10^{15}$ at about 100–240 Kev. Then a high energy body implant is carried out by either skipping a step of growing an implant oxide layer or implanting with an implant angle smaller than seven degree (7°), e.g., at zero degree relative to the perpendicular direction to the top surface of the substrate, to form a deep high concentration body region 165 with boron ions of an ion flux of about $3 \times 10^{14}$ to $1 \times 10^{16}/\text{cm}^2$ at about 100 to 300 Kev. A region in the lower portion of the body region 130 with higher body dopant concentration is formed because of the channeling effect as that shown in FIGS. 4E and 4F (to be further explained below). Further improvement of device ruggedness is achieved because of this channeling-body dopant region formed in a greater depth in the body region 130.

Figure 4E:
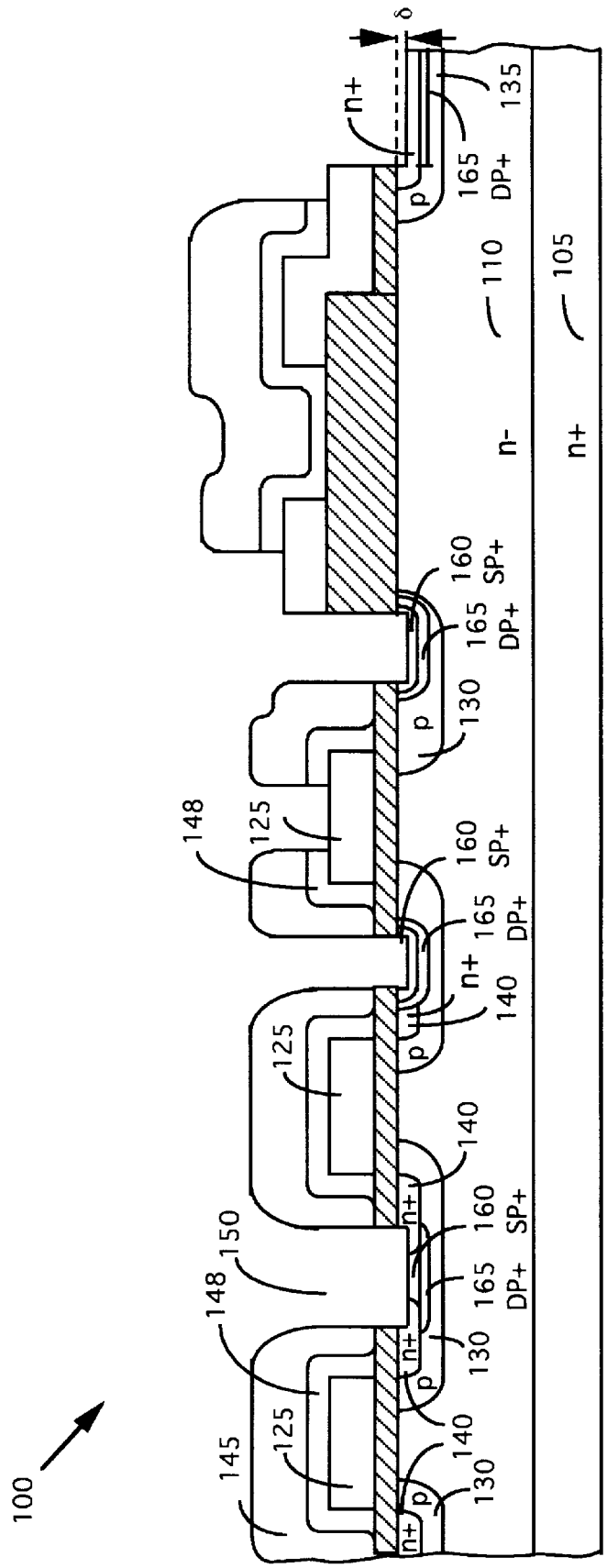
Figure 4F:
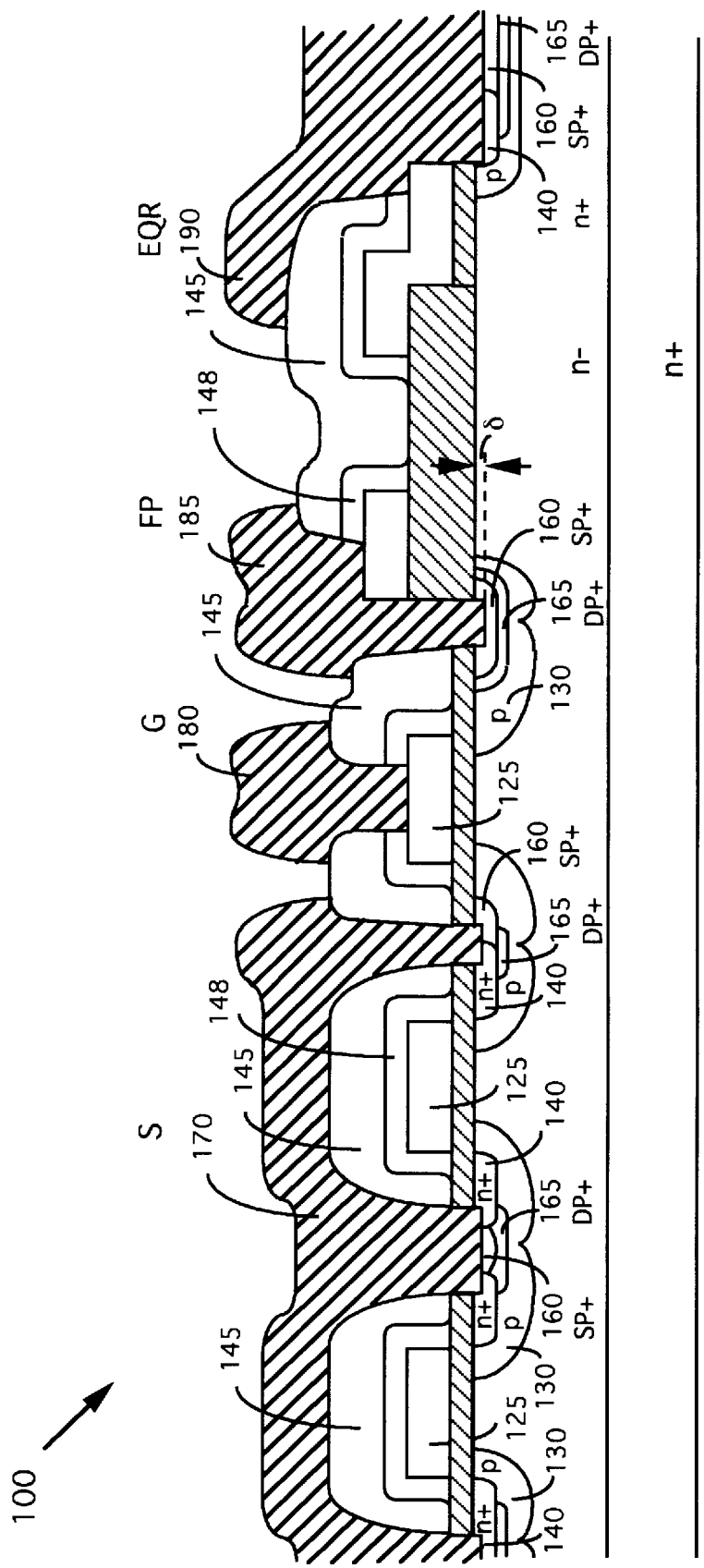

Referring to FIG. 4E, a BPSG reflow and densification process is performed at 900–950° C. for thirty minutes to one hour. The shallow body region 160 and the deep body region 165 are activated. An etch process is performed to remove a top portion of the silicon layer from the contact windows 150. The thickness δ of the top portion removed ranging from 300 to 3,000 Å. Referring to FIG. 4F, the contact resistance between the metal contact 170 and the source region 140 is reduced with the removal of this top portion because the low net source dopant concentration of the source region 140 at the top surface caused by body dopant implant compensation is now removed.

Figure 4G:
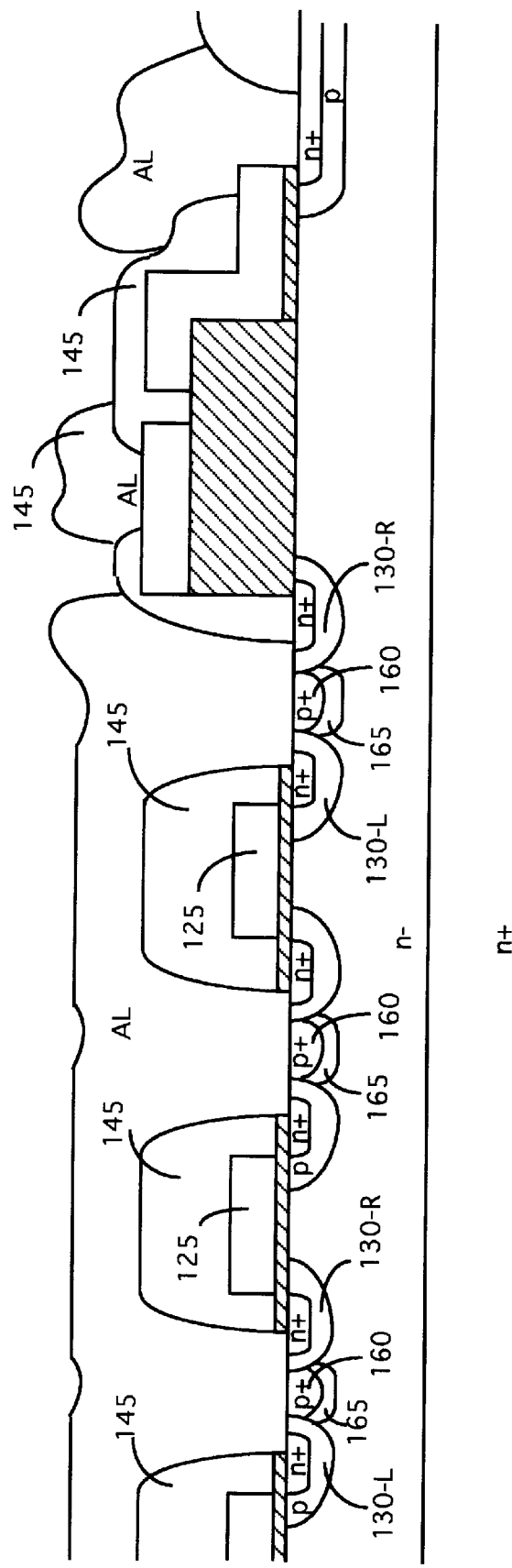
FIG. 4G shows another preferred embodiment of the present invention.

FIG. 4G shows another preferred embodiment where the p-body regions 130-L and 130-R are separated by a small distance when the left region 130-L and right regions 130-R are not merged by the lateral diffusion of these two regions during the p-body diffusion operation. The shallow p+ regions 160 and the deep p+ regions 165 function as the bridging p+ regions between the left p-body region 130-L and the right p-body region 130-R to bridge the gap between these two regions.

Therefore, in a first preferred embodiment, the present invention includes a DMOS fabrication process for fabricating a DMOS transistor 100 on a substrate 105. The fabrication process includes the steps of (a)growing an oxide layer 115 on the substrate; (b) applying a first mask for removing the oxide layer to define an active area and for selectively patterning the oxide layer for keeping a plurality of source implant blocking stumps 118 near a plurality source regions 140 in the substrate wherein the blocking stumps 118 being formed with width greater than twice a lateral diffusion length of a source dopant; (c) applying a second mask for forming a plurality of gates 125 covering a portion of areas between the blocking stumps thus defining an implant window; (d) implanting a body dopant through the implant window followed by a body diffusion for forming a body region 130 underneath the blocking stumps; (e) implanting the source dopant through the implant window over the source implant blocking stumps following by a source diffusion for forming separate source regions 140 underneath the blocking stumps; (f) forming an overlying insulation layer covering the DMOS transistor followed by applying a contact mask to open a plurality of contact openings 150 there-through; (g) performing a low energy body dopant implant and a high energy dopant implant to form a self aligned shallow high concentration body dopant region 160 and a self aligned deep high concentration body dopant region 165; (h) applying an etching process for removing a top portion of the substrate from the contact openings 150 for providing a source contact area of lower contact resistance; (i) depositing a metal layer 170 to form a contact layer through the contact window; and (j) patterning the metal layer with a metal contact to define a plurality of contacts whereby the DMOS transistor with improved device ruggedness and reduce source contact resistance is fabricated with a four masks process. In a preferred embodiment, the step (b) of selectively patterning the oxide layer for keeping a plurality of source implanting blocking stumps 118 is a step of patterning the implanting blocking stumps 118 with width less than twice a lateral diffusion length of the body dopant whereby the body regions merging together in the body diffusion and becoming a single body region underneath the blocking stumps.

Figure 5A:
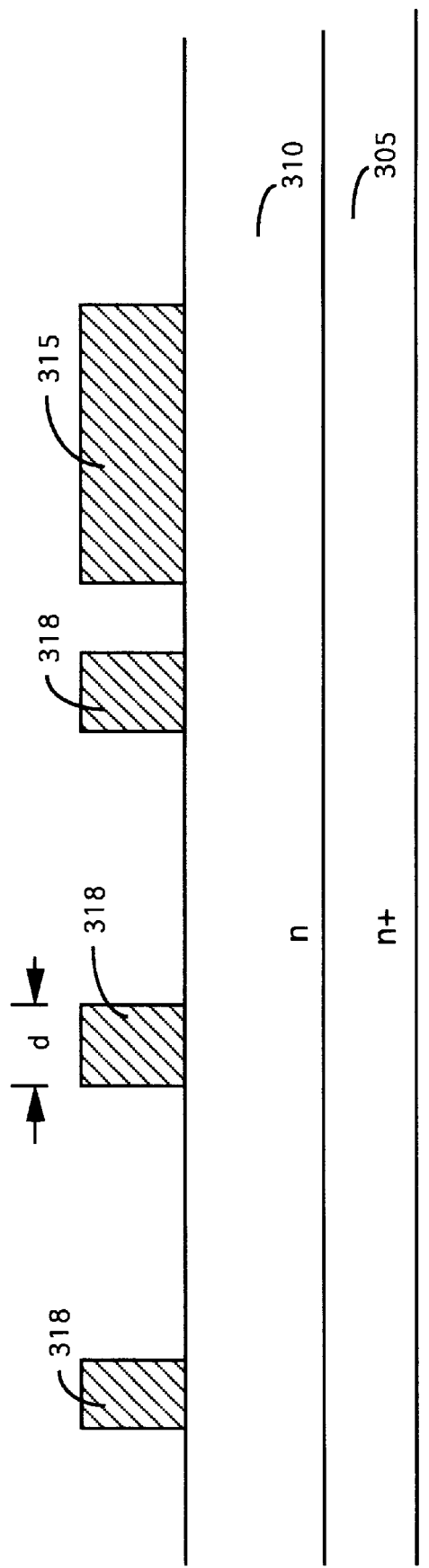
FIGS. 5A to 5H show the processing steps for manufacturing a trenched DMOS device of the present invention.

Please refer to FIGS. 5A to 5H for the processing steps for manufacturing a trenched DMOS device 300 of the present invention. As shown in FIG. 5A, the processing steps begins by first growing a N epitaxial layer 310 with a resistivity ranging from 0.1 to 10 ohm-cm on top of a N+ substrate 305. The substrate has a resistivity of 0.001 to 0.02 ohm-cm. The thickness and the resistivity of the epitaxial layer 310 depend on the device requirements for the on-resistance and breakdown voltage. In a preferred embodiment, the thickness of the epi-layer 310 is about three to twenty microns (3–20 $\mu$m). An initial oxide layer 315 of thickness in the range of 10 nm to 10 $\mu$m is grown. The thickness is chosen for the purpose of minimizing the parasitic effect as well as to block the implantation of the dopant in subsequent processing step as will be described below. The oxide layer 315 is then patterned by applying an active mask, i.e., the first mask, to define the active areas and a plurality of source-blocking "stumps" 318. The field oxide layer 315 is kept on the edge of the device area to form a termination area later in the fabrication processes. Additionally, different from the conventional fabrication processing method, a plurality of source-blocking stumps 318 are kept in source region (to be described later), as oxide pads, of the DMOS 300. The lateral dimension, i.e., d, of the blocking stumps is chosen to range between twice the lateral diffusion length of the source dopant, i.e., $2L_s$, and twice the lateral diffusion length of the body (channel) dopant, i.e., $2L_b$. The width d of the blocking stumps 318 can therefore be represented as that shown in Equation (1).

Figure 5B:
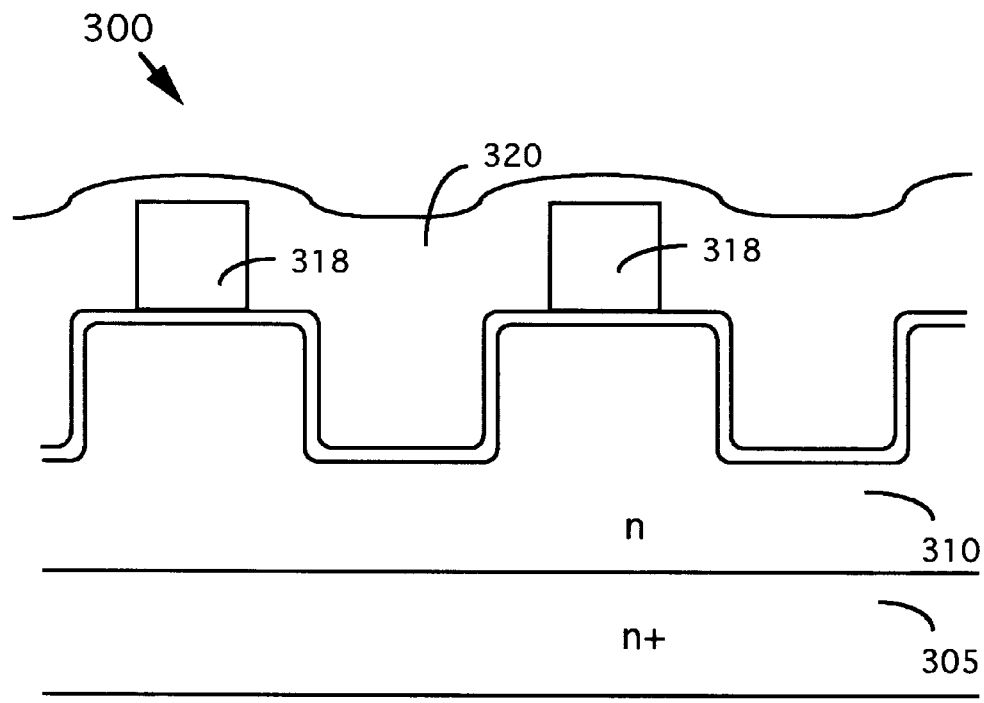
Figure 5C:
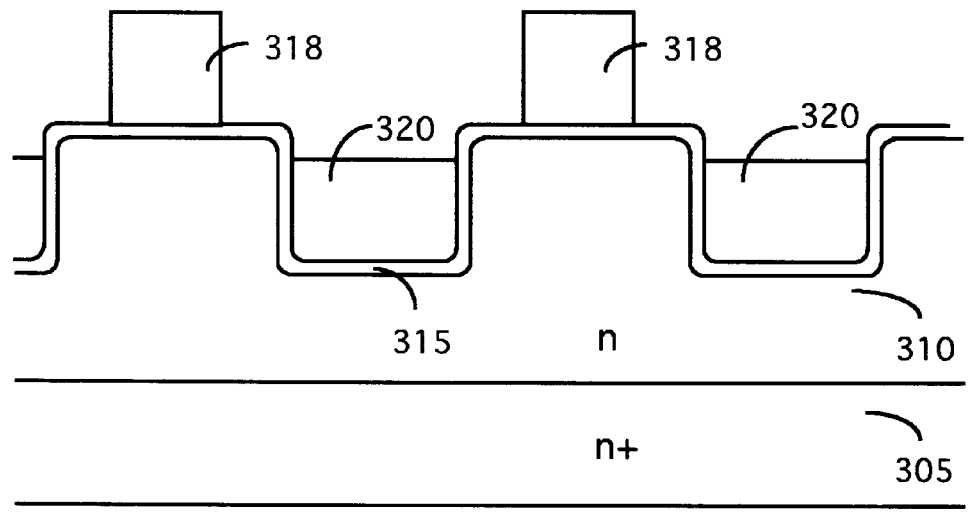

Referring to FIG. 5B, a photoresist is employed as a second mask, i.e., a trench mask. A trench etch process, which is a dry anisotropic etch process, is applied to form trenches of 1.0 to 2.0 microns and 1.0 to 2.0 micron in depth. A sacrification oxidation process is applied which can be either a dry or wet oxidation process conducted at a temperature of 900–1100° C. to form oxide layer of approximately 300–2000 Å in thickness which is followed by a sacrification oxide etch process. A gate oxide layer 319 is then formed by a gate oxidation process which can be a wet or dry oxidation process carried out at a temperature of 800 to 1100° C. to form a layer of thickness in the range of 300 to 1,000 Å. A poly deposition process is performed to deposit a poly layer 320 ranging from 1.5 to 3.0$\mu$ in thickness. A planarization etch is performed on the ploy layer 320 by etching a top layer to 0.2–0.4 $\mu$ from the deposited poly. A POCL$_3$ doping process is carried out at 950° C. to make the poly layer 320 have a sheet resistance of 20–40 ohm/cm$^2$. Referring to FIG. 5B, where a poly etch is carried out to dry etch the poly layer 320 till the top surface is removed while leaving the source blocking stumps 318 in place. The poly etch is performed with the end-point detection to terminate the etch process when the polysilicon layer 320 above the trench is removed.

Figure 5D:
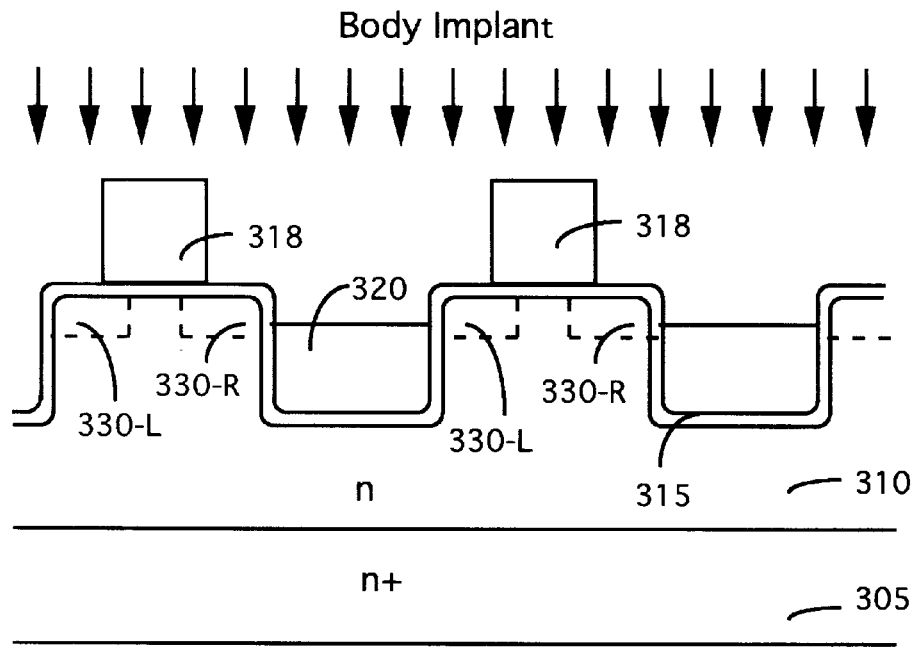
Figure 5E:
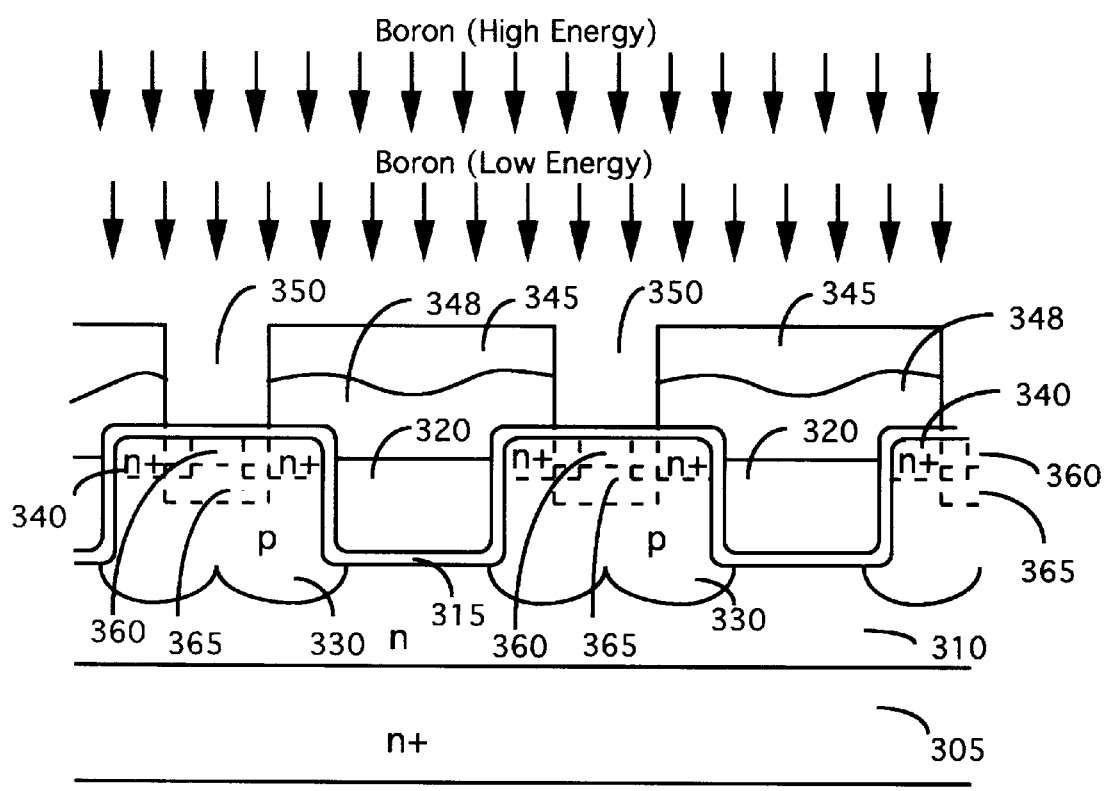

Referring to FIG. 5D, where a p-body implant with boron ions at 30–100 Kev with an ion beam of $2\times10^{13}$ to $2\times10^{14}/$cm$^2$ flux density is performed to form the p-body region 330. The body implant is blocked by the thick oxide pads 318 above the source region, i.e., the source-blocking stumps 318. Initially two separate p-body regions 330-L and 330-R are formed on the left and the right of the blocking stump 318 respectively. Referring to FIG. 5E, a p-body diffusion process is then carried out at an elevated temperature of 1,000–1,200° C. for ten minutes to three hours to increase the depth of the p-body region 330 to 1.0–2.0$\mu$. Because the lateral dimension, i.e., the width d of the stump 318, is less than twice the lateral diffusion length of the body dopants, these two separate p- body regions are merged into a single p-body region 330 underneath the blocking stump 318 as a result of the lateral diffusion of the body dopants during the diffusion process. The transistor 300 thus includes a diffusion-merged p-body region 330 wherein the profile of the diffusion-merged p-body 330 has a wide-shallow W-profile as that shown in FIG. 5E. Then a N$^+$ implantation is carried out with an arsenic or phosphorus ion beam at an energy of 50–100 Kev and ion flux density of $5\times10^{15}$ to $1\times10^{16}/cm^2$ The source blocking stumps 318 serves as source implant blocks to carry out an N+ implant to form the N+ region 340. Different from the conventional DMOS fabrication process, the source implant is performed without requiring a source mask The N$^+$ source regions 340 are driven into desired junction depth ranging from 0.2 to 1.0$\mu$ by a diffusion process at a temperature of 900–1000° C. for 10 minutes to two hours. Since the width d of the blocking stumps 318 exceed twice the lateral diffusion length of the lateral diffusion length of the source dopants, the source regions are not merged underneath the blocking stumps 318.

Figure 5F:
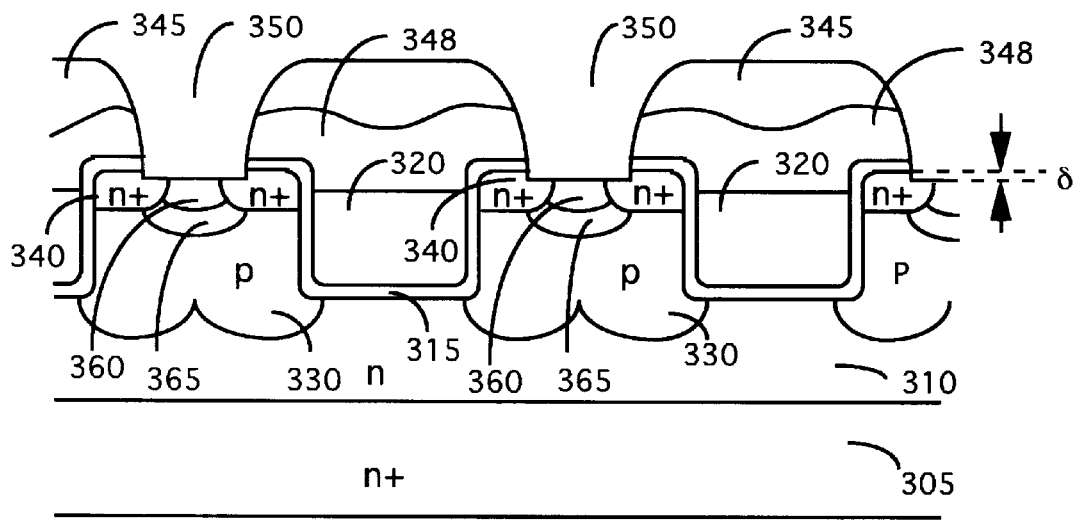

Referring to FIG. 5F, after the source blocking stumps 318 are removed, a NSG or PSG is deposited to form a first insulation layer 348 of approximately 1000–5,000 Å in thickness. A BPSG layer is deposited to form a second insulation layer 345 of about 5,000 to 15,000 Å in thickness. A contact mask is applied to perform an etching process to define a plurality of contact windows 350. A shallow body implant is performed to form a shallow high concentration body region 360 with either a low energy boron implant with an ion flux of $1\times10^{14}$ to $2\times10^{15}/cm^2$ at about 20 to 60 Kev or a high energy BF$_2$ implant with an ion flux of $1\times10^{14}/cm^2$ to $2\times10^{15}$ at about 100–240 Kev. Then a high energy body implant is carried out by either skipping a step of growing an implant oxide layer or implanting with an implant angle smaller than seven degree (7°), e.g., at zero degree relative to the perpendicular direction to the top surface of the substrate, to form a deep high concentration body region 365 with boron ions of an ion flux of about $3\times10^{14}$ to $1\times10^{16}/cm^2$ at about 100 to 300 Kev. A region in the lower portion of the body region 130 with higher body dopant concentration is formed because of the channeling effect as that shown in FIGS. 6E and 6F. Further improvement of device ruggedness is achieved because of this channeling-body dopant region formed in a greater depth in the body region 330.

Figure 5G:
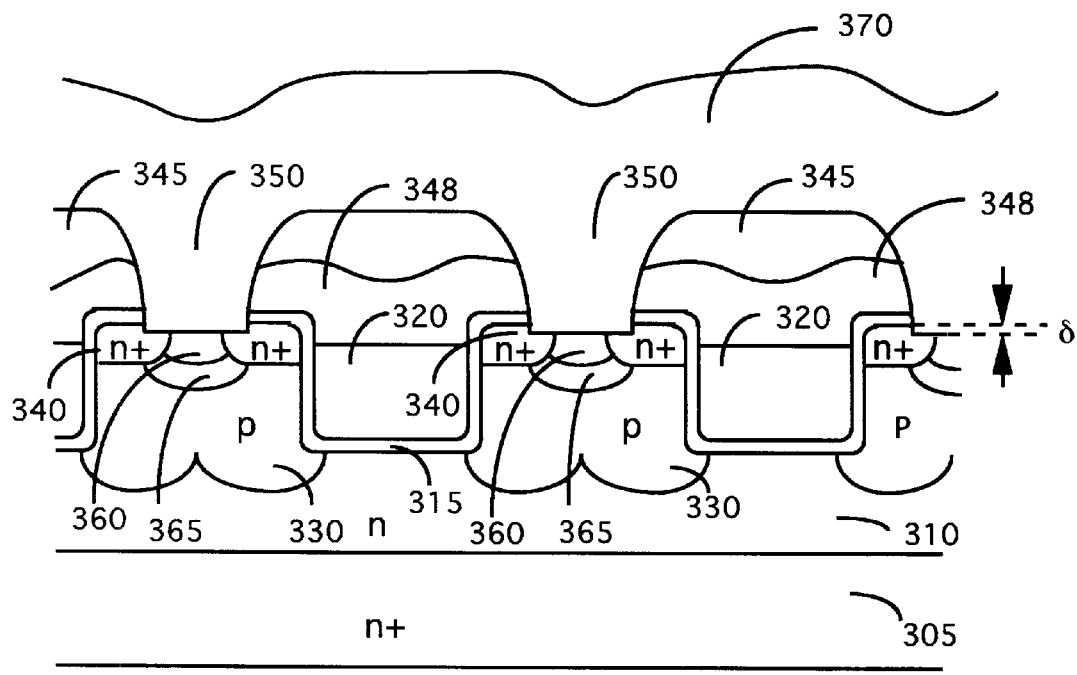

Referring to FIG. 5G, a BPSG reflow and densification process is performed at 900–950° C. for thirty minutes to one hour. The shallow body region 360 and the deep body region 365 are activated. An etch process is performed to remove a top portion of the silicon layer from the contact windows 350. The thickness b of the top portion removed ranging from 300 to 3,000 Å. The contact resistance between the metal contact 370 and the source region 340 is reduced with the removal of this top portion because the low net source dopant concentration of the source region 340 at the top surface caused by body dopant implant compensation is now removed.

Figure 5H:
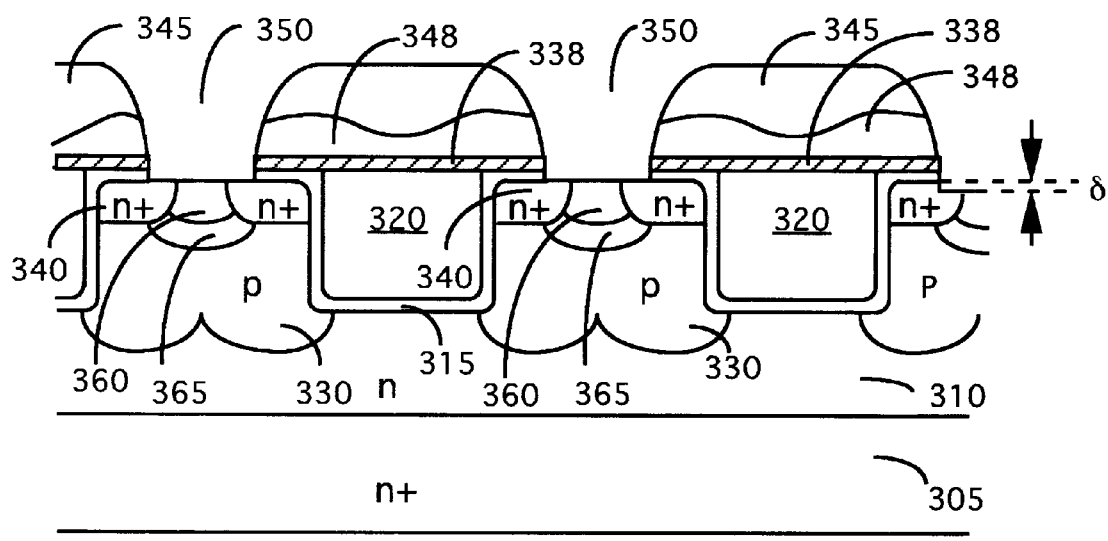

Referring to FIG. 5H for an alternate preferred embodiment with a low pressure chemical vapor deposition (LPCVD) nitride layer 338 formed over the top surface before the first insulation layer 348 and the second insulation layer 345 are deposited. A densification process of the insulation layers is performed. A contact mask, i.e., the third mask, is applied to perform an etching process through the PSG or BPSG layer 345 and the nitride layer 338 to define the contact windows. The final power DMOS device 300 is completed with the metal deposition and metal etching with a metal mask, i.e., the forth mask, to define the source contacts, the gate contacts, the field plate, equal potential ring, and the channel stop. By the use of a nitride layer 338, a pad mask, i.e., the fifth mask, is not necessary since a passivation layer and pad patterning is no longer required. Thus a four mask DMOS fabrication process is disclosed by applying a novel fabrication process which utilized specially patterned initial oxide layer with active mask to serve as a source implant blocking. A reduction in mask requirement is achieved. This improvement is accomplished because the fabrication process takes advantage of 1). the difference in lateral diffusion lengths of the body dopants and the source dopants, 2). making use of a nitride protection layer 338, and 3) applying a novel source implant blocking configuration to eliminate the requirement of a source blocking mask.

According to FIGS. 5A to 5H, this invention discloses a trenched DMOS transistor cell formed in a semiconductor substrate with a drain region of a first conductivity type formed at a bottom surface of the substrate. The trenched DMOS cell Includes polysilicon layer disposed in a trench constituting a gate for the transistor cell, the trench surrounding and defining an outer boundary of the transistor cell. The DMOS transistor cell further includes a source region of the first conductivity disposed in the substrate near the trench. The DMOS transistor cell further includes a body region of a second conductivity type disposed in the substrate occupying an entire region surrounded by the trench thus encompassing the source region. The body region defining substantially a merged-double-U-shaped region including a left-U-shaped implant region and a right-U-shaped implant region and a merged region disposed substantially at a central portion surrounded by the trench. In a preferred embodiment, the merged double-U-shaped region constituting the body region further includes a deep high concentration body dopant region and a shallow high concentration body dopant region. In another preferred embodiment, the shallow high concentration body dopant region further includes an exposed substrate top surface constituting an enhanced source contact surface defined by a removed top layer of the shallow high concentration body dopant region. In another preferred embodiment, the DMOS transistor cell further includes a low pressure chemical vapor deposition (LPCVD) nitride layer covering the trench for preventing mobile ions from entering the transistor cell.

Figure 6A:
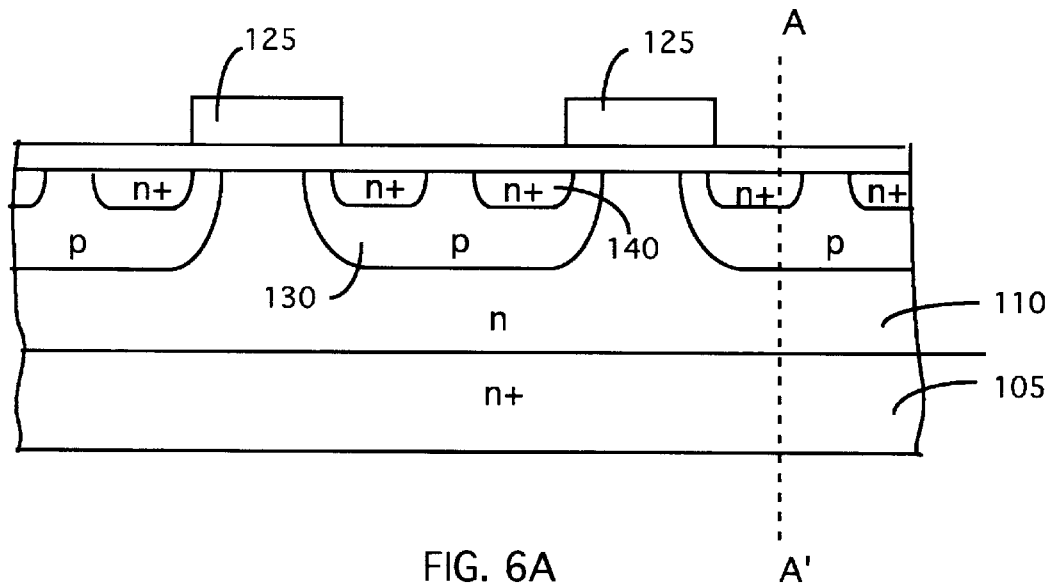
FIGS. 6A to 6J are a set of cross sectional views and net dopant concentration profiles for illustrating the fabrication processes of the present invention.
Figure 6B:
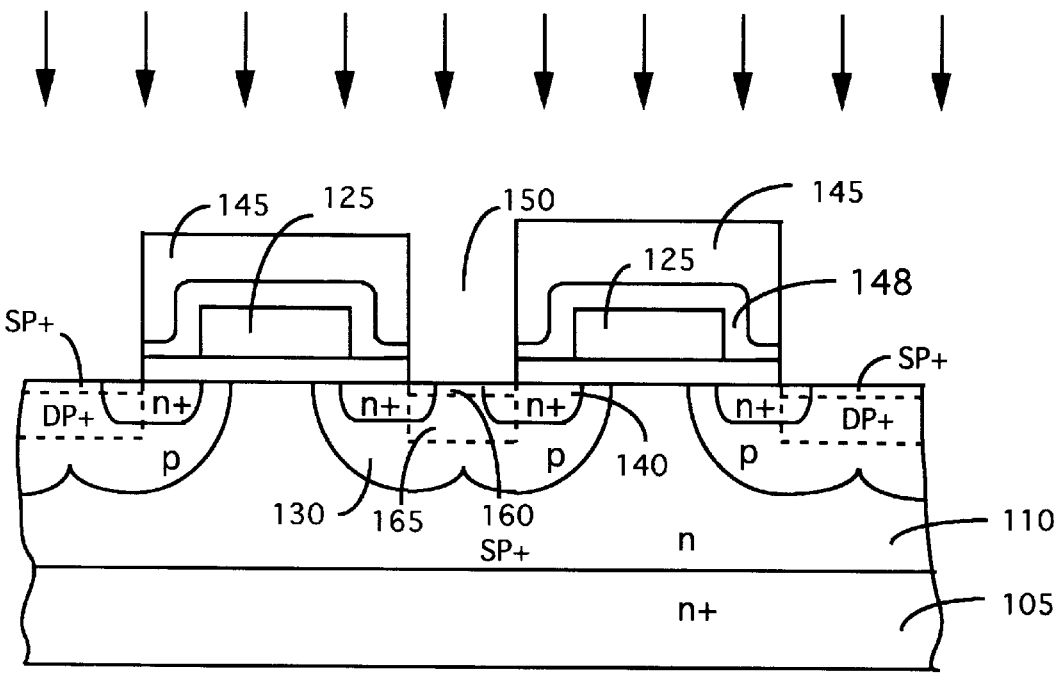
Figure 6C:
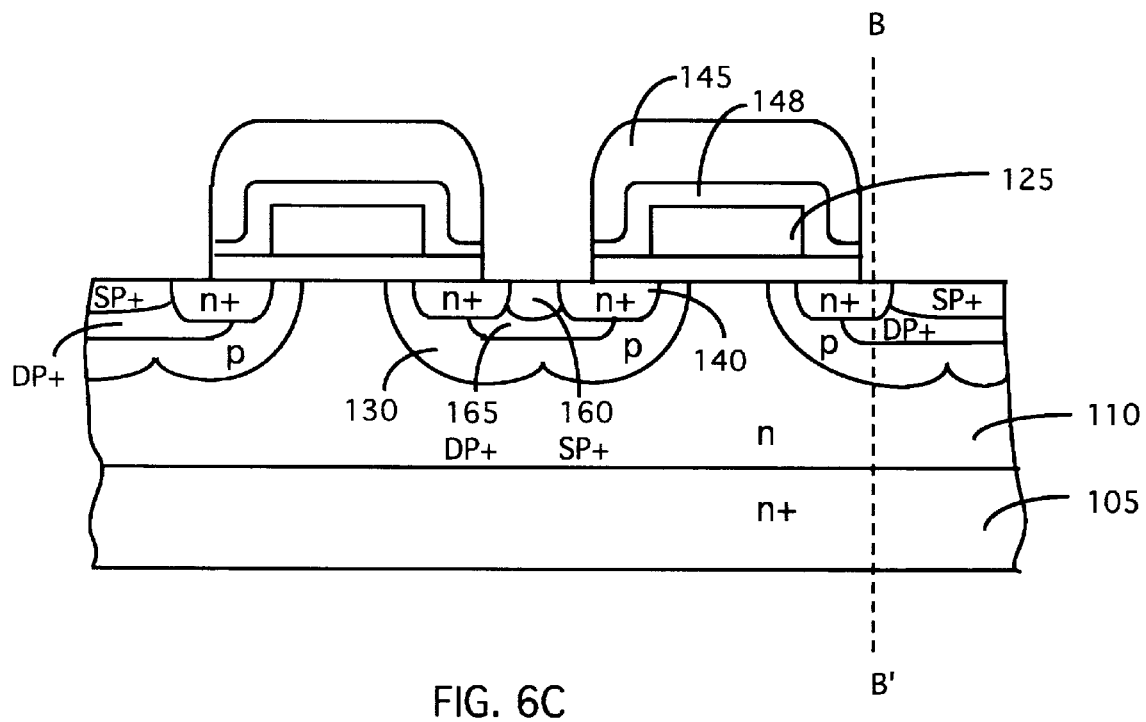
Figure 6D:
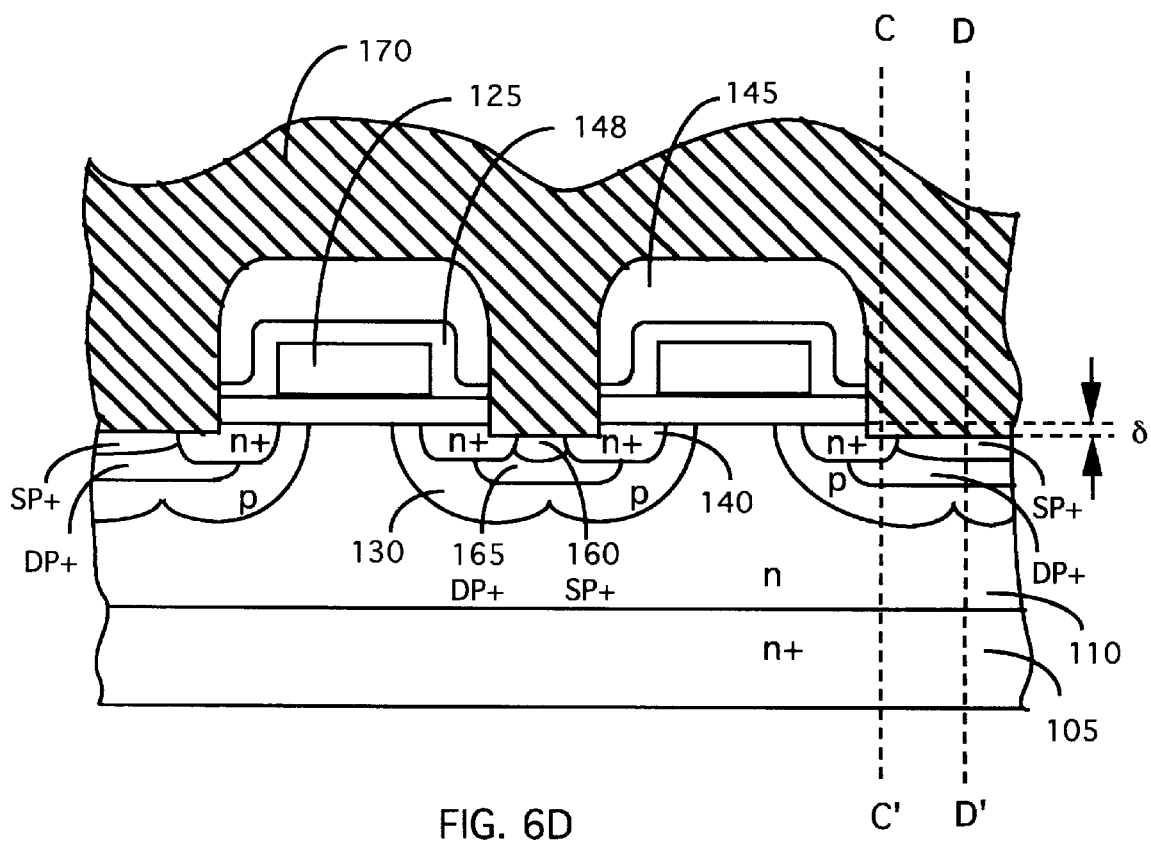

FIGS. 6A to 6D are cross sectional of the DMOS manufactured according to the method of this invention and FIGS. 6E to 6J are diagrams of the net dopant concentration profiles along the lines shown in FIGS. 6A and 6D. With detail manufacture processes described above, no detail descriptions are necessary for understanding the cell structures shown in FIGS. 6A to 6D. These cross sectional views are used to explain how the device ruggedness is further improved by taking advantage of the channeling effect according to the concentration profiles shown in FIGS. 6E to 6J below. The advantages of the present invention can be appreciated by referring to the net dopant concentration profiles as shown in FIGS. 6E to 6J.

Figure 6E:
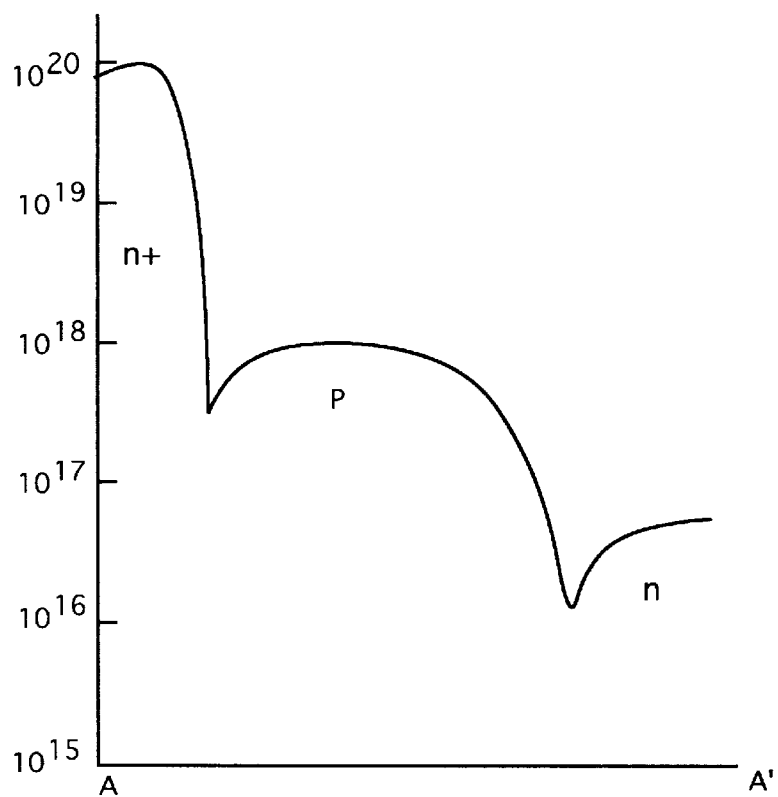
Figure 6F:
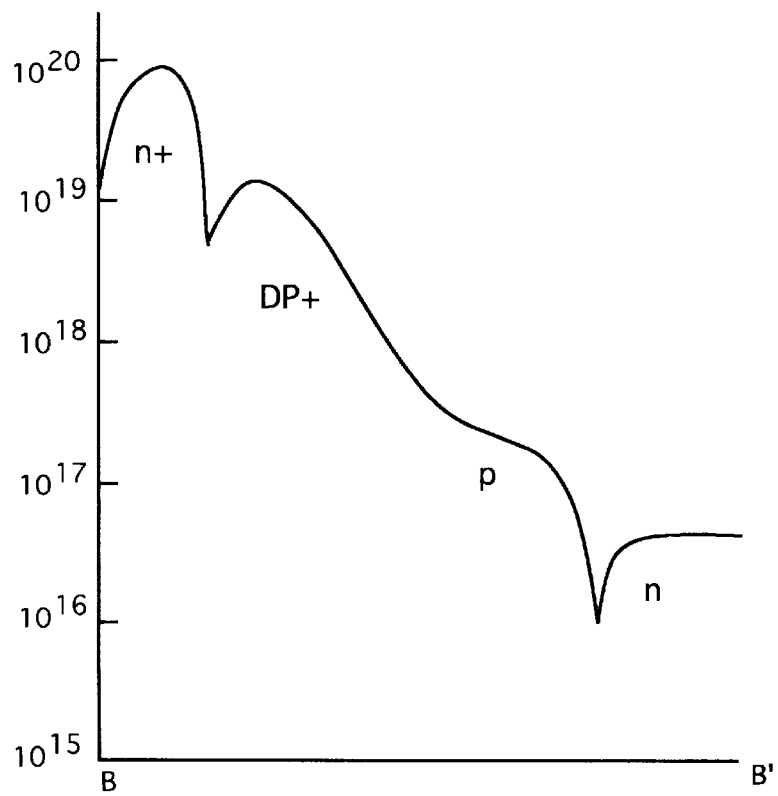
Figure 6G:
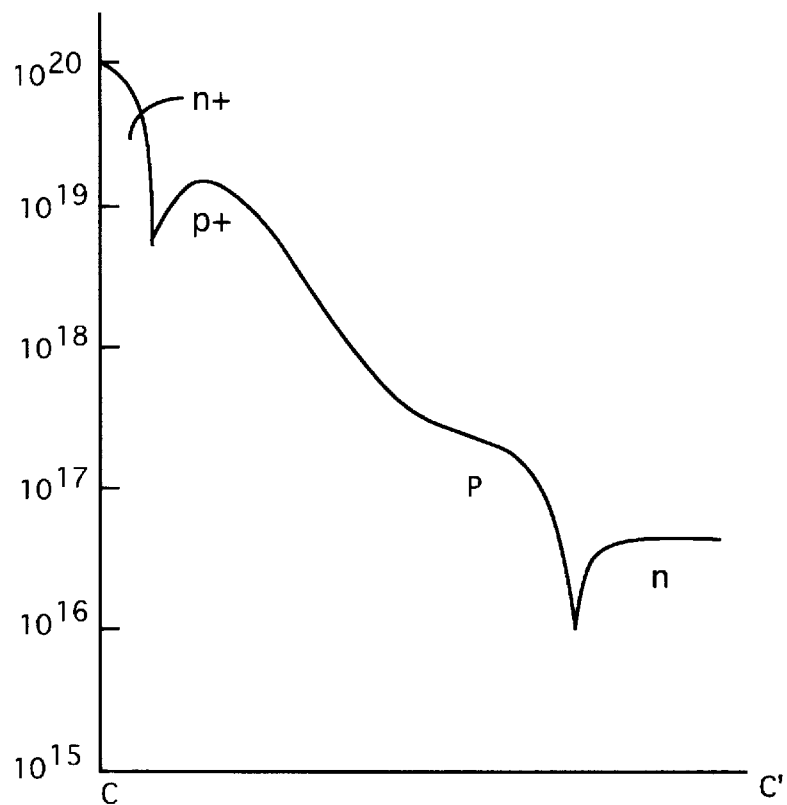
Figure 6H:
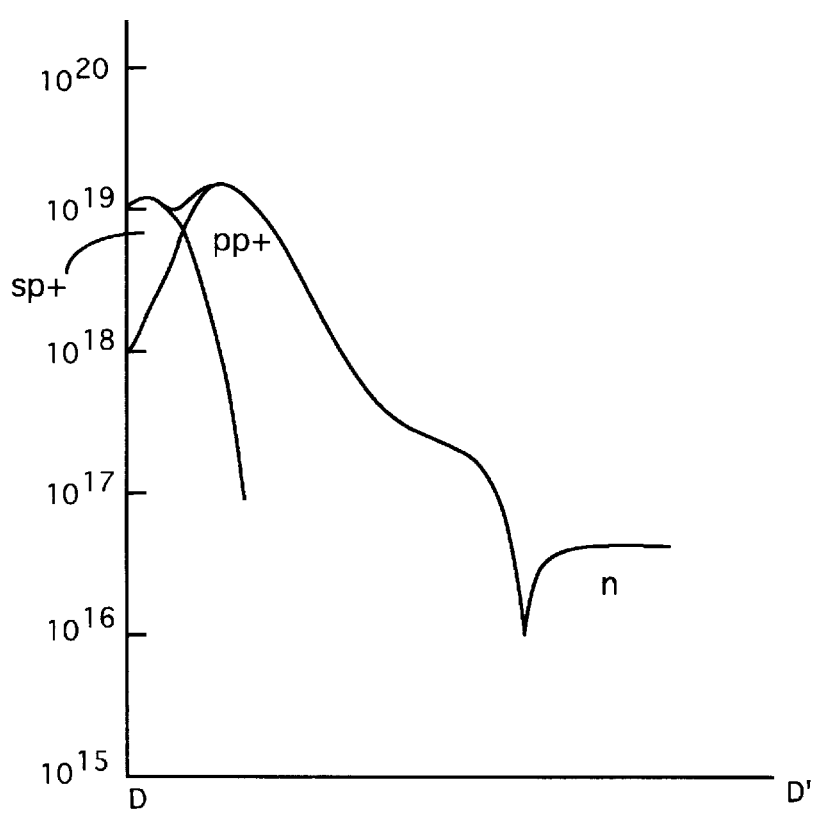
Figure 6I:
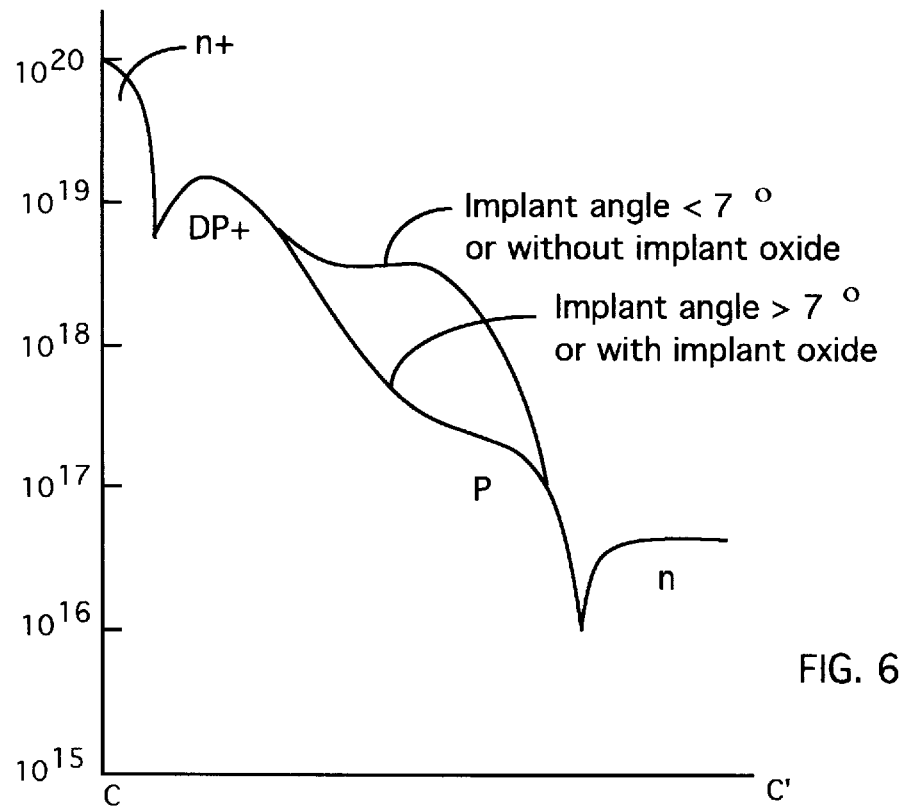
Figure 6J:
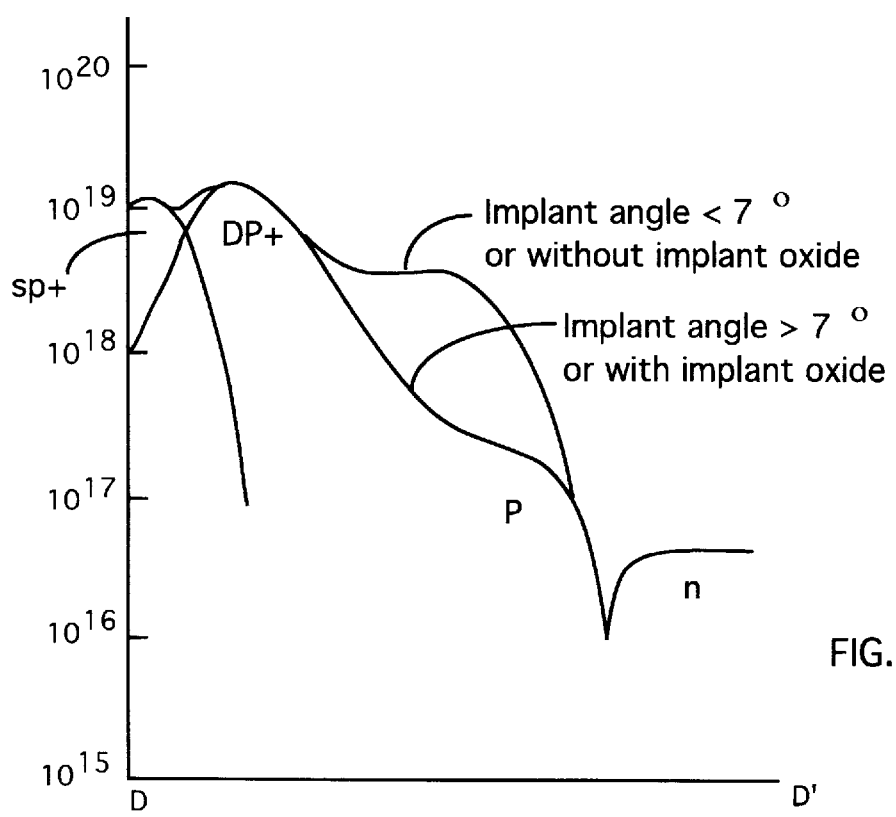

In FIG. 6E, a net dopant concentration along line A–A' of FIG. 6A is shown. This net dopant concentration profile is a typical profile without having a deep high concentration body dopant region. Referring to FIG. 6F, along the line B–B' in FIG. 6C, a deep P+ region 165 (DP+) is formed. In the meantime, the source ion concentration at the top surface near point B is decreased. This is caused by the compensation of the implant of the shallow high concentration body region 160 which reduces the net source ion concentration near the top surface of the source regions 140. Referring to FIGS. 6G and 6H along the lines C–C' and D–D' in FIG. 6D. After the top layer of thickness 6 is removed, the portion of the source region 140 which has lower net dopant concentration is removed. Thus the difficulty of higher contact resistance caused by a lower net source dopant concentration at the top surface due to the shallow p+ body implantation is removed. Referring to FIG. 6D, the contact resistance in shallow p+ region 160 is also improved. Furthermore, the device ruggedness is improved with a deep P+ body region 165 formed underneath the source region 140. FIGS. 6I and 6J are the net dopant concentration profiles along lines C–C' and D–D' respectively which are further improved when the deep body implant is carried out by taking advantage of a channeling effect by either skipping the process of growing a layer of implant oxide or by arranging an implant angle smaller than a regular implant angle of seven degrees, i.e., 7° relative to the perpendicular direction to a top surface of the substrate. It is a general industry practice to grow an implant oxide to prevent implant damage. As the activation temperature employed in this invention is kept at a relatively low level to avoid a stacking fault induced by a higher temperature during the activation process, thus the process of growing an implant oxide layer may be skipped to obtain the benefit of further improved device ruggedness with a channeling enhanced profile. By implanting either without an oxide layer or by implanting the deep high concentration body region with implant angle less than 7°, the body dopant ion can penetrate through a greater depth into the body region without being scattered by either the implant oxide or the particles in the lattice structure. The greater body dopant concentration beneath the deep body implant region 165 further improve the ruggedness of the device. Because this higher body dopant concentration deep down in the body region serve the purpose of further reducing the resistance in the lower body region. The likelihood of incidentally turning on the parasitic bipolar transistor due a voltage drop across that region is therefore further reduced.

In summary, a method for fabricating a trenched DMOS transistor 300 supported on a substrate 305 is also disclosed which comprises the steps of (a) growing an oxide layer 315 on the substrate; (b) applying a first mask for removing the oxide layer to define an active area and for selectively patterning the oxide layer for keeping a plurality of source implant blocking stumps 318 near a plurality source regions 340 in the substrate wherein the blocking stumps 318 being formed with width greater than twice a lateral diffusion length of a source dopant; (c) applying a second mask for forming a plurality of trenches between the blocking stumps 318 and forming a gate 320 in each of the trenches thus defining a plurality of implant windows between the gates 320 and the blocking stumps 318; (d) implanting a body dopant through the implant window followed by a body diffusion for forming a body region 330 underneath the blocking stumps 318; and (e) implanting the source dopant through the implant window over the source implant blocking stumps following by a source diffusion for forming separate source regions 340 underneath the blocking stumps 318.

Therefore, the present invention provides an improved DMOS fabrication process to enable those of ordinary skill in the art of DMOS fabrication to reduce the number of masks such that the limitations encountered in the prior art can be overcome. Specifically, in this improved DMOS fabrication process, the requirement of applying a separate mask specifically for forming the source regions is eliminated such that the number of masks required to fabricate a DMOS transistor is reduced. This is accomplished by use of an active mask for patterning the initial oxide layer which is specially configured to form a plurality of source implant blocking stumps above the surface areas near the source regions for the purpose of eliminating the mask requirement in performing the source implant. Furthermore, the source implant blocking stumps patterned by the use of an active mask is specially designed to have an appropriate width less than twice the lateral diffusion length of the body dopants while greater than twice the lateral diffusion length of the source dopants. A body-merge can take place in body diffusion process to form an integral body underneath the source-block stumps while the source regions will not be merged underneath the blocking stumps during diffusion whereby the source regions can be formed with appropriate geometrical profile in the body regions. By applying the DMOS fabrication processes of this invention, a simplified fabrication method is therefore employed by reducing the number of masks thus reducing the cost of manufacture and meanwhile increasing the production yield-rate for DMOS fabrication.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A DMOS transistor cell formed in a semiconductor substrate with a drain region of a first conductivity type formed at a bottom surface of said substrate, said DMOS cell comprising:

a polysilicon layer constituting a gate supported on a top surface of said substrate, said gate surrounding and defining an outer boundary of said transistor cell having a removed polysilicon opening disposed substantially in a central portion of said cell;

a source region of said first conductivity disposed in said substrate near edges of said removed polysilicon opening with a portion extends underneath said gate;

a body region of a second conductivity type disposed in said substrate occupying an entire region under said removed polysilicon opening thus encompassing said source region and having a portion extends underneath said gate; and said body region defining substantially a merged-double-U-shaped region including a left-U-shaped implant region having a left U-bottom diffusion profile and a right-U-shaped implant region having a right u-bottom diffusion profile and a merged region having a diffusion merged double-U bottom profile disposed substantially at a central portion under said removed polysilicon opening.

2. The DMOS transistor cell of claim 1 wherein:

said merged double-U-shaped region with said diffusion merged double-U bottom profile constituting said body region having said left and right U-bottom diffusion profiles further includes a deep high concentration body dopant region and a shallow high concentration body dopant region.

3. The DMOS transistor cell of claim 2 further comprising:

an exposed step-down enhanced source-contact surface having a top surface lower than a top surface surrounding said enhanced source-contact surface defined by removing a top layer of said shallow high concentration body dopant region.

4. A DMOS transistor cell formed in a semiconductor substrate with a drain region of a first conductivity type formed at a bottom surface of said substrate, said DMOS cell comprising:
- a polysilicon layer constituting a gate supported on a top surface of said substrate, said gate surrounding and defining an outer boundary of said transistor cell having a removed polysilicon opening disposed substantially in a central portion of said cell;
- a source region of said first conductivity disposed in said substrate near edges of said removed polysilicon opening with a portion extends underneath said gate;
- a deep high concentration body dopant region of a second conductivity type disposed substantially in a central portion under said removed polysilicon opening;
- a body region of a second conductivity type disposed in said substrate occupying an entire region under said removed polysilicon opening thus encompassing said source region and having a portion extends underneath said gate; and
- said body region includes a left body region having a left U-bottom diffusion profile and a right body region having a left u-bottom diffusion profile connected by said deep high concentration body dopant region having a U-bottom diffusion profile.

5. The DMOS transistor cell of claim 4 wherein:
said body region further includes a shallow high concentration body dopant region disposed in said substrate above said deep high concentration body dopant region having a U-bottom diffusion profile extended to substantially a same depth as said left body region and said right body region.

6. The DMOS transistor cell of claim 4 further comprising:
an exposed step-down enhanced source-contact surface having a top surface lower than a top surface surrounding said enhanced source-contact surface defined by removing a top layer of said shallow high concentration body dopant region.

7. A trenched DMOS transistor cell formed in a semiconductor substrate with a drain region of a first conductivity type formed at a bottom surface of said substrate, said DMOS cell comprising:
- a polysilicon layer disposed in a trench constituting a gate for said transistor cell, said trench surrounding and defining an outer boundary of said transistor cell;
- a source region of said first conductivity disposed in said substrate near said trench; a body region of a second conductivity type disposed in said substrate occupying an entire region surrounded by said trench thus encompassing said source region; and
- said body region defining substantially a merged-double-U-shaped region including a left-U-shaped implant region having a left u-bottom diffusion profile and a right-U-shaped implant region having a right U-bottom diffusion profile and a merged region having a diffusion merged double-U bottom profile disposed substantially at a central portion surrounded by said trench.

8. The DMOS transistor cell of claim 7 wherein:
said merged double-U-shaped region having said diffusion merged double-U bottom profile constituting said body region having said left and right u-bottom diffusion profiles further includes a deep high concentration body dopant region and a shallow high concentration body dopant region.

9. The DMOS transistor cell of claim 8 further comprising:
an exposed step-down enhanced source-contact surface having a top surface lower than a top surface surrounding said enhanced source-contact surface defined by removing a top layer of said shallow high concentration body dopant region.

10. A trenched DMOS transistor cell formed in a semiconductor substrate with a drain region of a first conductivity type formed at a bottom surface of said substrate, said DMOS cell comprising:
- a polysilicon layer disposed in a trench constituting a gate for said transistor cell, said trench surrounding and defining an outer boundary of said transistor cell;
- a source region of said first conductivity disposed in said substrate near said trench;
- a deep high concentration body dopant region of a second conductivity type disposed substantially in a central portion of said transistor cell;
- a body region of a second conductivity type disposed in said substrate occupying an entire region surrounded by said trench thus encompassing said source region; and
- said body region includes a left body region having a left U-bottom diffusion profile and a right body region having a left U-bottom diffusion profile connected by said deep high concentration body dopant region having a U-bottom diffusion profile.

11. The DMOS transistor cell of claim 10 wherein:
said body region further includes a shallow high concentration body dopant region disposed in said substrate above said deep high concentration body dopant region with said U-bottom diffusion profile.

12. The DMOS transistor cell of claim 10 further comprising:
an exposed step-down enhanced source-contact surface having a top surface lower than a top surface surrounding said enhanced source-contact surface defined by removing a top layer of said deep high concentration body dopant region.

13. A trenched DMOS transistor cell formed in a semiconductor substrate with a drain region of a first conductivity type formed at a bottom surface of said substrate, said DMOS cell comprising:
- a polysilicon layer disposed in a trench constituting a gate for said transistor cell, said trench surrounding and defining an outer boundary of said transistor cell;
- a source region of said first conductivity disposed in said substrate near said trench;
- a deep high concentration body dopant region of a second conductivity type disposed substantially in a central portion of said transistor cell;
- a body region of a second conductivity type disposed in said substrate occupying an entire region surrounded by said trench thus encompassing said source region;
- said body region includes a left body region having a left U-bottom diffusion profile and a right body region having a right U-bottom diffusion profile connected by said deep high concentration body dopant region; and
- a low pressure chemical vapor deposition (LPCVD) nitride layer covering said trench for preventing mobile ions from entering said transistor cell.

* * * * *